US012622163B2

(12) United States Patent
Cho et al.

(10) Patent No.:  US 12,622,163 B2
(45) Date of Patent:       May 5, 2026

(54) DISPLAY DEVICE AND METHOD FOR MANUFACTURING THE SAME

(71) Applicant: Samsung Display Co., Ltd., Yongin-si (KR)

(72) Inventors: Youngmin Cho, Seongnam-si (KR); Hyunwoo Lee, Seongnam-si (KR); Hongam Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 846 days.

(21) Appl. No.: 17/876,853

(22) Filed: Jul. 29, 2022

(65) Prior Publication Data

US 2023/0145495 A1       May 11, 2023

(30) Foreign Application Priority Data

Nov. 9, 2021    (KR) ........................ 10-2021-0153103

(51) Int. Cl.
H10K 77/10 (2023.01)
H10K 71/00 (2023.01)
*H10K 102/00* (2023.01)

(52) U.S. Cl.
CPC ........... H10K 77/111 (2023.02); H10K 71/00 (2023.02); *H10K 2102/311* (2023.02)

(58) Field of Classification Search
CPC .................................................. H10K 77/111
See application file for complete search history.

(56) References Cited

U.S. PATENT DOCUMENTS

| | | | | |
|---|---|---|---|---|
| 9,991,467 | B2 * | 6/2018 | Namkung ............ | H10K 59/873 |
| 10,285,278 | B2 | 5/2019 | Namkung et al. | |
| 10,804,490 | B2 | 10/2020 | Namkung et al. | |
| 11,038,003 | B2 | 6/2021 | Park et al. | |
| 11,805,669 | B2 | 10/2023 | Kim et al. | |
| 11,817,019 | B2 | 11/2023 | Jin et al. | |
| 2020/0185641 | A1 * | 6/2020 | Jeong ................. | H10K 59/8791 |
| 2020/0295303 | A1 | 9/2020 | Nishimura et al. | |
| 2020/0381671 | A1 | 12/2020 | Cha et al. | |
| 2021/0328179 | A1 | 10/2021 | Qiao et al. | |

FOREIGN PATENT DOCUMENTS

| | | |
|---|---|---|
| EP | 3564781 A1 | 11/2019 |
| KR | 1020150030042 A | 3/2015 |
| KR | 1020150031096 A | 3/2015 |
| KR | 1020160130921 A | 11/2016 |

(Continued)

OTHER PUBLICATIONS

European Search Report for European Patent Application No. 22204316.8 dated Mar. 21, 2023.

*Primary Examiner* — Douglas M Menz
(74) *Attorney, Agent, or Firm* — CANTOR COLBURN LLP

(57) ABSTRACT

A display device includes a display panel including a first area including a pixel and at which the display panel is foldable, a second area on which a driver connected to the pixel is disposed, and a bending area between the first area and the second area and at which the display panel is bendable, a functional layer on the first area, and a protective layer on the bending area, a groove is defined in one surface of the protective layer, which does not face the display panel, and the groove is adjacent to the first area.

12 Claims, 24 Drawing Sheets

(56)         References Cited

FOREIGN PATENT DOCUMENTS

| KR | 20190087792 A | 7/2019 |
|---|---|---|
| KR | 20200128286 A | 11/2020 |
| KR | 1020200138529 A | 12/2020 |
| KR | 20210046917 A | 4/2021 |
| KR | 1020210104509 A | 8/2021 |
| KR | 20210113480 A | 9/2021 |
| KR | 20210113547 A | 9/2021 |

* cited by examiner

DP

PX
PX1  DPX  PX2     HA1     DA2  BNA  DA1
                          DA

TA

TA

DISPLAY DEVICE AND METHOD FOR MANUFACTURING THE SAME

This U.S. non-provisional patent application claims priority under 35 U.S.C. § 119 of Korean Patent Application No. 10-2021-0153103, filed on Nov. 9, 2021, the entire contents of which are hereby incorporated by reference.

BACKGROUND

(1) Field

The present disclosure herein relates to a display device and a method for manufacturing the same.

(2) Description of the Related Art

Various types of display devices have been developed with the development of technology of display devices. For example, various flexible display devices that are deformed into a curved shape, foldable or rollable are being developed. The flexible display device may be easily carried and improve a convenience of using the flexible display device.

Among the flexible display devices, a foldable display device is foldable with respect to a folding axis. The foldable display device may include a display module that is foldable with respect to the folding axis and a support part which is below the display module to support the display module. The support part may be foldable together with the display module.

The display module includes a display panel that generates and/or displays an image and a driver which is on the display panel. The display panel includes a first area, a second area, and a bending area between the first and second areas. The first area includes a plurality of pixels driven by the driver to display an image. The first area is foldable with respect to the folding axis. The driver is mounted on the second area, and the bending area is bendable so that the second area is disposed below the first area. Thus, the first area which is folded disposes the driver under the first area and not visually recognizable from outside the display device.

SUMMARY

The present disclosure provides a display device that is capable of preventing a bending area from being damaged and a method for manufacturing (or providing) the display device.

An embodiment of the invention provides a display device including a display panel including a first area including a pixel and at which the display panel is foldable, a second area on which a driver connected to the pixel is disposed, and a bending area between the first area and the second area and at which the display panel is bendable, a functional layer on the first area, and a protective layer on the bending area, a groove is defined in one surface of the protective layer, which does not face the display panel, and the groove is adjacent to the first area.

In an embodiment of the invention, a method for manufacturing (or providing) a display device includes providing a display panel including a first area including a pixel and at which the display panel is foldable, a second area on which a driver connected to the pixel is disposed, and a bending area between the first area and the second area and at which the display panel is bendable, providing a functional layer and a release film which is on the functional layer, on the first area, providing a protective layer on the bending area, forming a groove in one surface of the protective layer, which does not face the display panel, and removing the release film, where the groove is adjacent to the first area.

In an embodiment of the invention, an electronic device includes a display device including a transmission area through which an optical signal passes, a control module which controls an operation of the display device, an electro-optical module which faces the display device, overlaps the transmission area, and receives the optical signal through the transmission area, and a first case and a second case which together accommodates the display device and the electro-optical module and with which the display device is foldable. The display device includes a display panel including a first area including a pixel and at which the display panel is foldable, a second area on which a driver connected to the pixel is disposed, and a bending area between the first area and the second area and at which the display panel is bendable, a functional layer on the first area, and a protective layer on the bending area, a groove is defined in one surface of the protective layer, which does not face the display panel, and the groove is adjacent to the first area.

a display device in which a transmission area through which an optical signal passes, is defined, a control module configured to control an operation of the display device, an electro-optical module under the display device, configured to overlap the first transmission area, and configured to receive the optical signal, and first and second cases configured to accommodate the display device and the electro-optical module and with which the display device is foldable. The display device includes a display panel including a first area provided with a plurality of pixels and is foldable with respect to a folding axis, a second area on which a driver connected to the pixels is disposed, and a bending area between the first and second areas and bendable so that the second area is disposed under the first area, a functional layer disposed on the first area, and a protective layer on the bending area, where a groove is defined in one surface of the protective layer which does not face the display panel, and the groove is adjacent to the first area.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
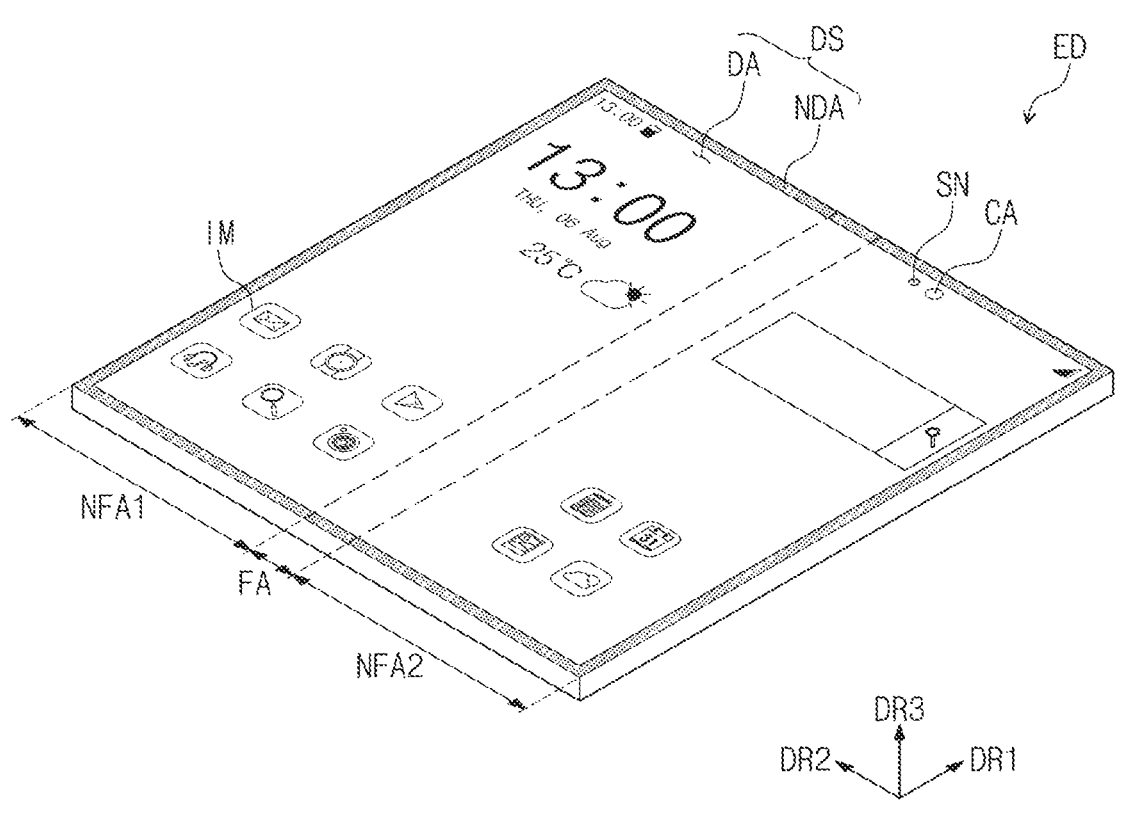
FIG. 1 is a perspective view of an electronic device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. Also, in the figures, the thickness, ratio, and dimensions of components are exaggerated for clarity of illustration.

In this specification, it will also be understood that when one component (or area, layer, portion) is referred to as being related to another element such as being "on", "connected to", or "coupled to" another component, it can be directly disposed/connected/coupled on/to the one component, or an intervening third component may also be present. In contrast, when one component (or area, layer, portion) is referred to as being related to another element such as being "directly on", "directly connected to", or "directly coupled to" another component, no intervening third component is present.

The terminology used herein is for the purpose of describing particular embodiments only and is not intended to be limiting. As used herein, "a", "an," "the," and "at least one"

do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in an embodiment without departing from the scope of the appended claims.

The terms of a singular form may include plural forms unless referred to the contrary. As used herein, a reference number may indicate a singular element or a plurality of the element. For example, a reference number labeling a singular form of an element within the drawing figures may be used to reference a plurality of the singular element within the text of specification.

Also, "under", "below", "above', "upper", and the like are used for explaining relation association of components illustrated in the drawings. The terms may be a relative concept and described based on directions expressed in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by a person of ordinary skill in the art to which the invention belongs. In addition, terms such as terms defined in commonly used dictionaries should be interpreted as having a meaning consistent with the meaning in the context of the related technology, and unless explicitly defined here, they are interpreted as too ideal or too formal sense.

The meaning of 'include' or 'comprise' specifies a property, a fixed number, a step, an operation, an element, a component or a combination thereof, but does not exclude other properties, fixed numbers, steps, operations, elements, components or combinations thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
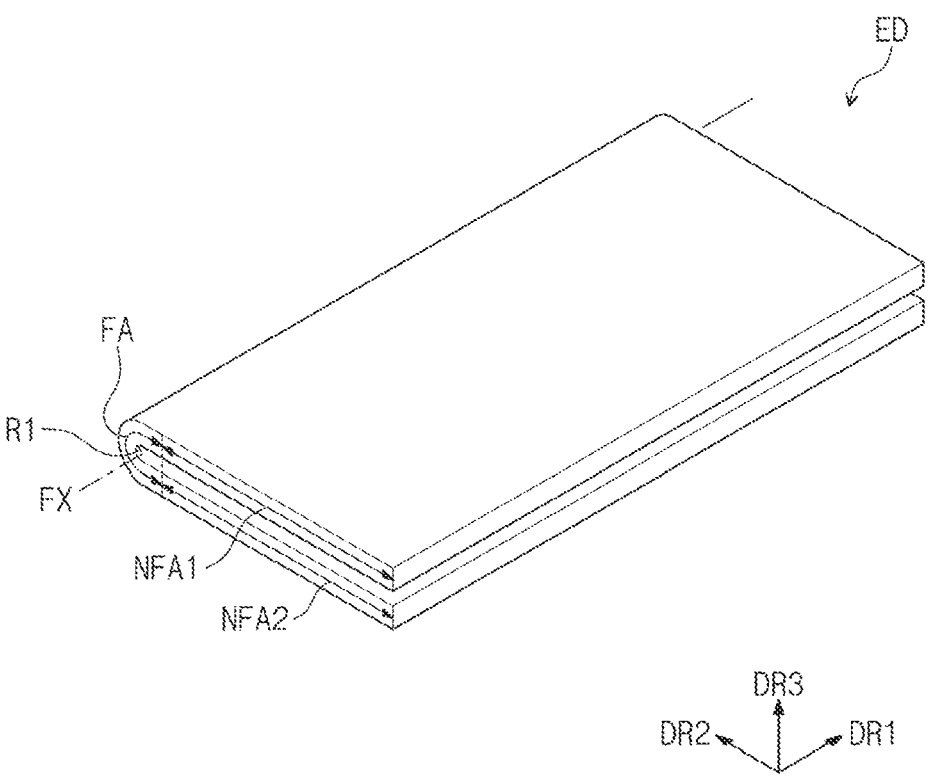
FIGS. 2 and 3 are views illustrating a folded state of the electronic device of FIG. 1.
Figure 3:
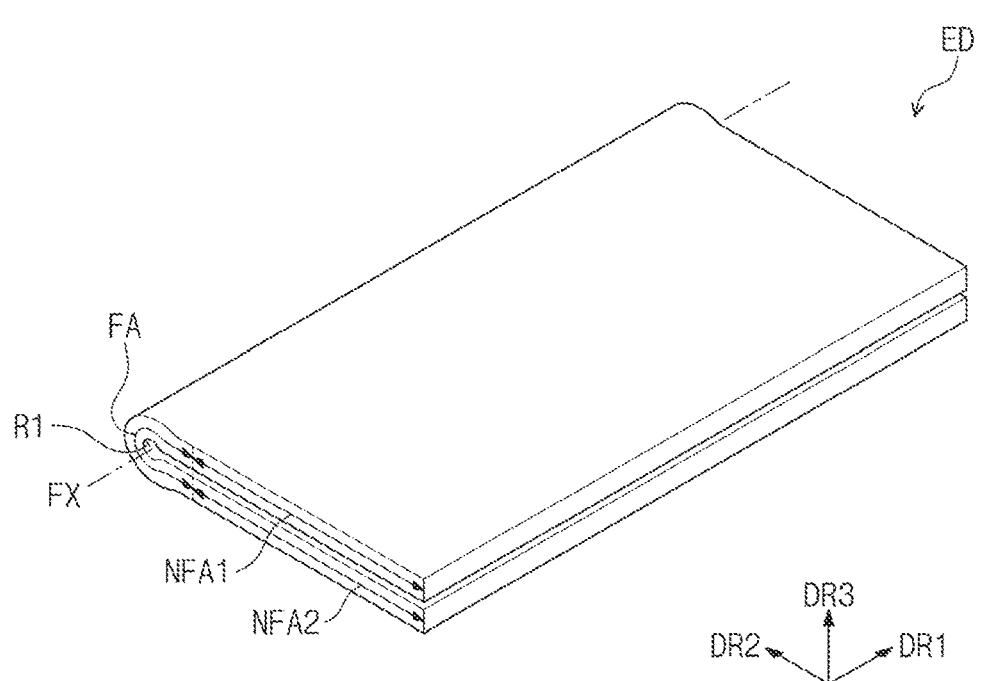

FIG. 1 is a perspective view of an electronic device ED according to an embodiment of the invention. FIGS. 2 and 3 are views illustrating a folded state of the electronic device ED of FIG. 1.

Referring to FIG. 1, an electronic device ED according to an embodiment of the invention has a rectangular shape having long sides extending in a first direction DR1, and short sides extending in a second direction DR2 crossing the first direction DR1. However, the embodiment of the invention is not limited thereto. For example, the electronic device ED may have various shapes such as a circular shape, a polygonal shape, and the like. The electronic device ED may be a flexible display device.

Hereinafter, a direction that substantially perpendicularly crosses a plane defined by the first direction DR1 and the second direction DR2 is defined as a third direction DR3. A thickness direction of the electronic device ED and various components or layers thereof may be defined along the third direction DR3. Also, in this specification, the term "viewed from the plane" or "in a plan view" may be defined as a state when viewed in (or along) the third direction DR3.

The electronic device ED may include a folding area FA and a non-folding area provided in plural including a plurality of non-folding areas NFA1 and NFA2 which are adjacent to the folding area FA. The electronic device ED may be foldable at the folding area FA. The electronic device ED and various components and layers thereof may be foldable together with each other, at the folding area FA. The non-folding areas NFA1 and NFA2 may include a first non-folding area NFA1 and a second non-folding area NFA2. The folding area FA may be disposed between the first non-folding area NFA1 and the second non-folding area NFA2. The folding area FA, the first non-folding area NFA1, and the second non-folding area NFA2 may be arranged in the second direction DR2.

For example, although one folding area FA and two non-folding areas NFA1 and NFA2 are illustrated, the embodiment of the invention is not limited thereto. For example, the number of the folding area FA and the number of the non-folding areas NFA1 and NFA2 are not limited thereto. For example, the electronic device ED may include more than two non-folding areas and a plurality of folding areas between the respective non-folding areas.

A top surface of the electronic device ED may be defined as a display surface DS and have a plane defined by the first direction DR1 and the second direction DR2. One or more of an image IM generated in the electronic device ED may be provided to outside the electronic device ED through the display surface DS.

The display surface DS may include a display area DA and a non-display area NDA which is adjacent to the display area DA. An image IM may be displayed on the display area DA, but may not be displayed on the non-display area NDA. The non-display area NDA may surround the display area DA and define an edge of the electronic device ED, which is printed with a predetermined color.

The electronic device ED may include one or more functional module that provides a function to the electronic device ED and/or to a component thereof. Among functional modules, the electronic device ED may include at least one sensor SN and at least one camera CA. The sensor SN and the camera CA may be adjacent to the edge of the electronic device ED. The sensor SN and the camera module CAM may be disposed on a portion of the display area DA which is adjacent to (or closest to) the non-display area NDA. The sensor SN and the camera CA may be disposed in the second non-folding area NFA2, but is not limited thereto. For example, the sensor SN and the camera CA may be disposed on the first non-folding area NFA1.

As an input, light may be transmitted through portions of the electronic device ED in which the sensor SN and the camera CA are disposed and then may be provided to the camera CA and the sensor SN. For example, the sensor SN may be a proximity sensor, but the type of the sensor SN is not limited thereto. The camera CA may photograph an external image. A plurality of sensors SN and cameras CA may be provided.

Referring to FIGS. 2 and 3, the electronic device ED may be a folding-type (foldable) electronic device ED that is capable of being folded or unfolded. For example, the folding area FA may be bendable with respect to a folding axis FX parallel to the first direction DR1, and thus, the electronic device ED may be folded about the folding axis FX. The folding axis FX may be defined as a long axis that is parallel to the long side of the electronic device ED.

When folding the electronic device ED, the first non-folding area NFA1 and the second non-folding area NFA2 may face each other, and the electronic device ED may be in-folded to prevent the display surface DS from being exposed to the outside (of the electronic device ED). However, the embodiment of the invention are not limited thereto. For example, the electronic device ED may be out-folded so that the display surface DS is exposed to the outside with respect to the folding axis FX.

As illustrated in FIG. 2, in the electronic device ED which is folded, a distance between the first non-folding area NFA1 and the second non-folding area NFA2 may be substantially the same as a curvature radius R1. However, the embodiment of the invention is not limited thereto, and as illustrated in FIG. 3, in the electronic device ED which is folded, a distance between the first non-folding area NFA1 and the second non-folding area NFA2 may be less than the curvature radius R1.

Figure 4:
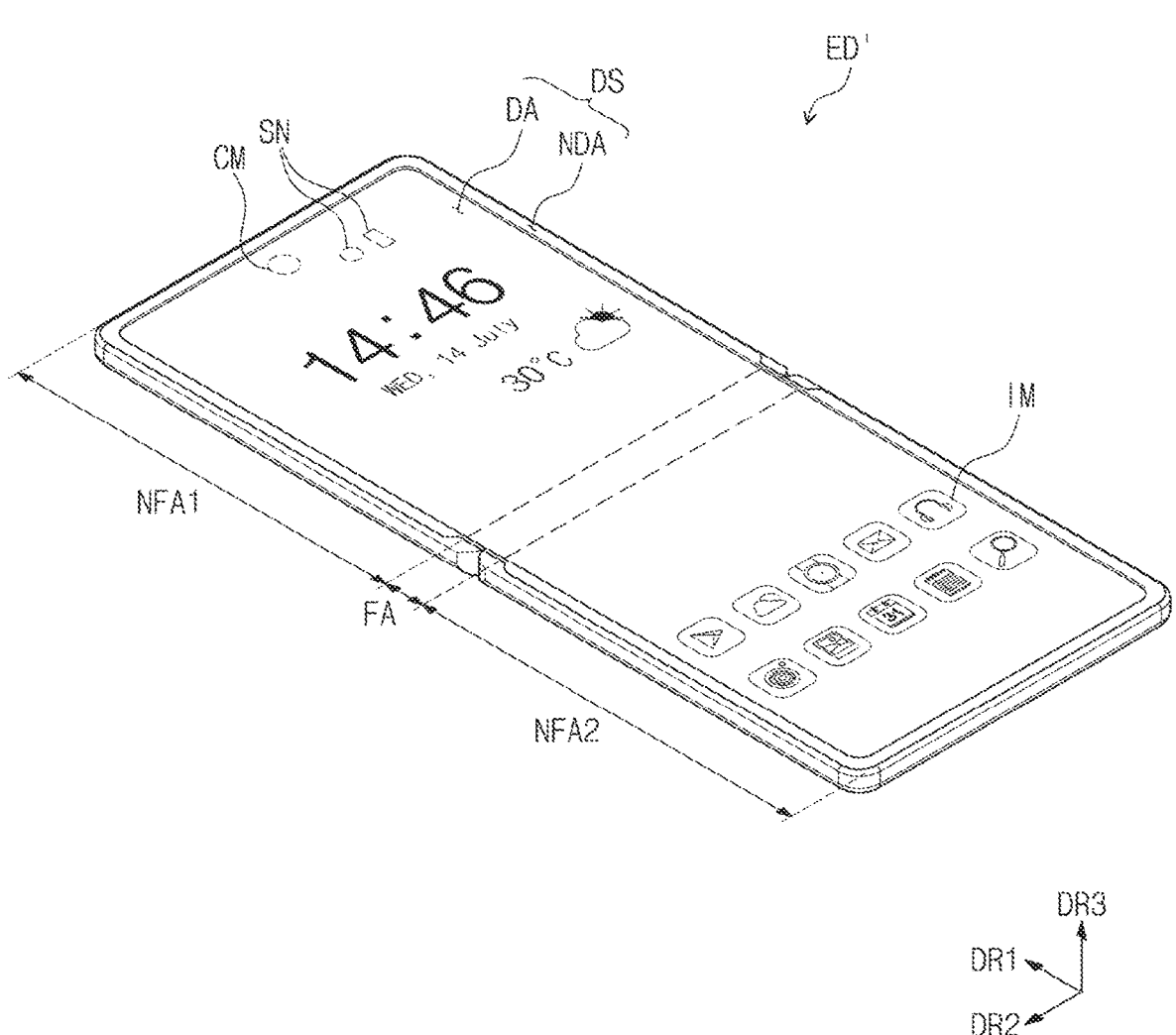
FIG. 4 is a perspective view of an electronic device according to an embodiment of the invention.
Figure 5:
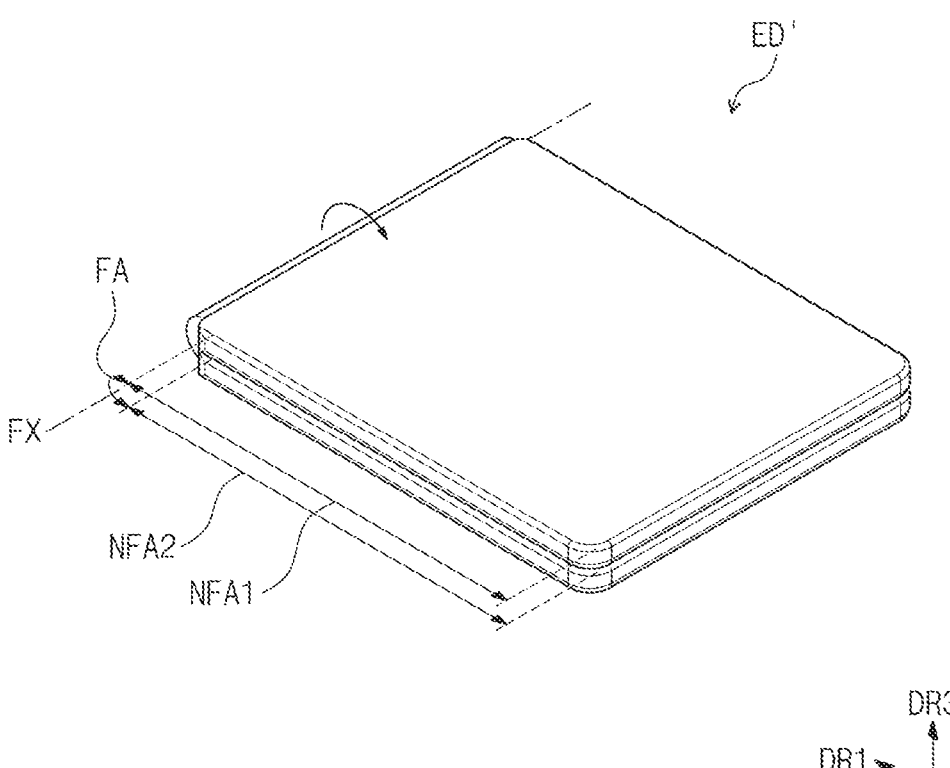
FIG. 5 is a view illustrating a folded state of the electronic device of FIG. 4.

FIG. 4 is a perspective view of an electronic device ED' according to an embodiment of the invention. FIG. 5 is a view illustrating a folded state of the electronic device ED' of FIG. 4.

Referring to FIG. 4, an electronic device ED' according to an embodiment of the invention has a rectangular shape having long sides extending in the first direction DR1 and short sides extending in the second direction DR2. The electronic device ED' may include a plurality of sensors SN and a camera CM. The sensors SN and the camera CM may be disposed on the first non-folding area NFA1, but the arranged positions of the sensors SN and the camera CM are not limited thereto.

Referring to FIG. 5, the electronic device ED' may be a folding-type (foldable) electronic device ED' that is capable of being folded or unfolded. For example, the folding area FA may be bent with respect to a folding axis FX parallel to the second direction DR2, and thus, the electronic device ED' may be folded. The folding axis FX may be defined as a short axis parallel to a short side of the electronic device ED'. The electronic device ED' may be in-folded, but is not limited thereto. For example, the electronic device ED' may be out-folded.

Hereinafter, configurations of the invention will be described with reference to the electronic device ED that is folded with respect to the long axis illustrated in FIGS. 1 to 3. However, the configurations to be described below may also be applied to the electronic device ED' that is folded with respect to the short axis illustrated in FIGS. 4 and 5.

Figure 6:
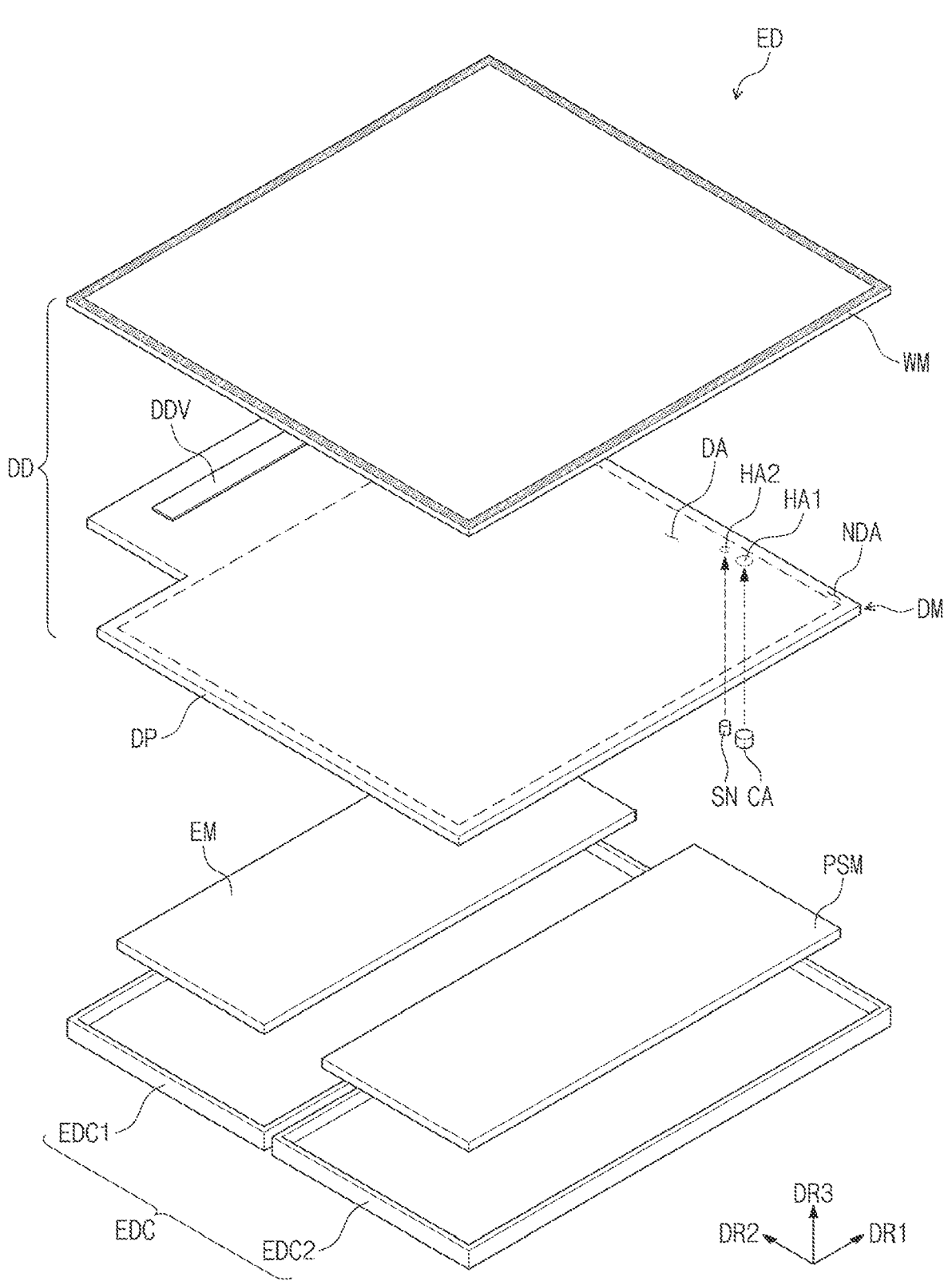
FIG. 6 is an exploded perspective view of the electronic device of FIG. 1.

FIG. 6 is an exploded perspective view of the electronic device ED of FIG. 1.

Referring to FIG. 6, the electronic device ED may include a display device DD, a camera CA, a sensor SN, an electronic module EM, a power module PSM, and a case EDC. Although not shown separately, the electronic device ED may further include a mechanical structure (e.g., a hinge) controlling a folding operation of the display device DD.

The display device DD may generate an image IM and sense an external input. The display device DD may include a window module WM and a display module DM. The window module WM may provide a front surface of the electronic device ED. The window module WM may be disposed on the display module DM to protect the display module DM. The window module WM may transmit light generated in the display module DM to provide the light to the outside.

The display module DM may include at least a display panel DP. Although only the display panel DP among the stacked structures of the display module DM is illustrated in FIG. 6, the display module DM may further include a plurality of components disposed above and below the display panel DP. A detailed laminated structure of the display module DM will be described in detail below.

The display panel DP may include a display area DA and a non-display area NDA, which correspond to the display area DA (see FIG. 1) and the non-display area NDA (see FIG. 1) of the electronic device ED, respectively. In this specification, "area/portion and that area/portion corresponds" may mean that overlap each other and are not limited to the same area.

A first transmission area HA' and a second transmission area HA2 may be defined in the display panel DP. Each of a transmission area the first transmission area HA' and the second transmission area HA2 may have light transmittance greater than an area surrounding such light transmission areas. The camera CA may be disposed under (or corresponding to) the first transmission area HAL and the sensor SN may be disposed under the second transmission area HA2. The light passing through the first and second transmission areas HA1 and HA2 from outside the electronic device ED, may be provided to the camera CA and the sensor SN.

The display module DM may include a data driver DDV disposed on the non-display area NDA of the display panel DP. The data driver DDV may be manufactured (or provided) in the form of an integrated circuit chip and mounted on the non-display area NDA. However, the embodiment of the invention is not limited thereto, and the data driver DDV may be mounted on a flexible circuit board connected to the display panel DP.

The electronic module EM and the power module PSM may be disposed under the display device DD. Although not shown, the electronic module EM and the power module PSM may be connected to each other through a separate flexible circuit board. The electronic module EM may control an operation of the display device DD. The power module PSM may supply power to the electronic module EM.

The case EDC may accommodate therein the display device DD, the electronic module EM, and the power module PSM. The case EDC may include two cases, e.g., a first case EDC1 and a second case EDC2 to fold the display device DD. The first and second cases EDC1 and EDC2 may extend in the first direction DR1 and may be arranged in the second direction DR2.

Although not shown, the electronic device ED may further include a hinge structure that connects the first and second cases EDC1 and EDC2 to each other. The case EDC may be coupled to the window module WM. The case EDC may protect the display device DD, the electronic module EM, and the power module PSM.

Figure 7:
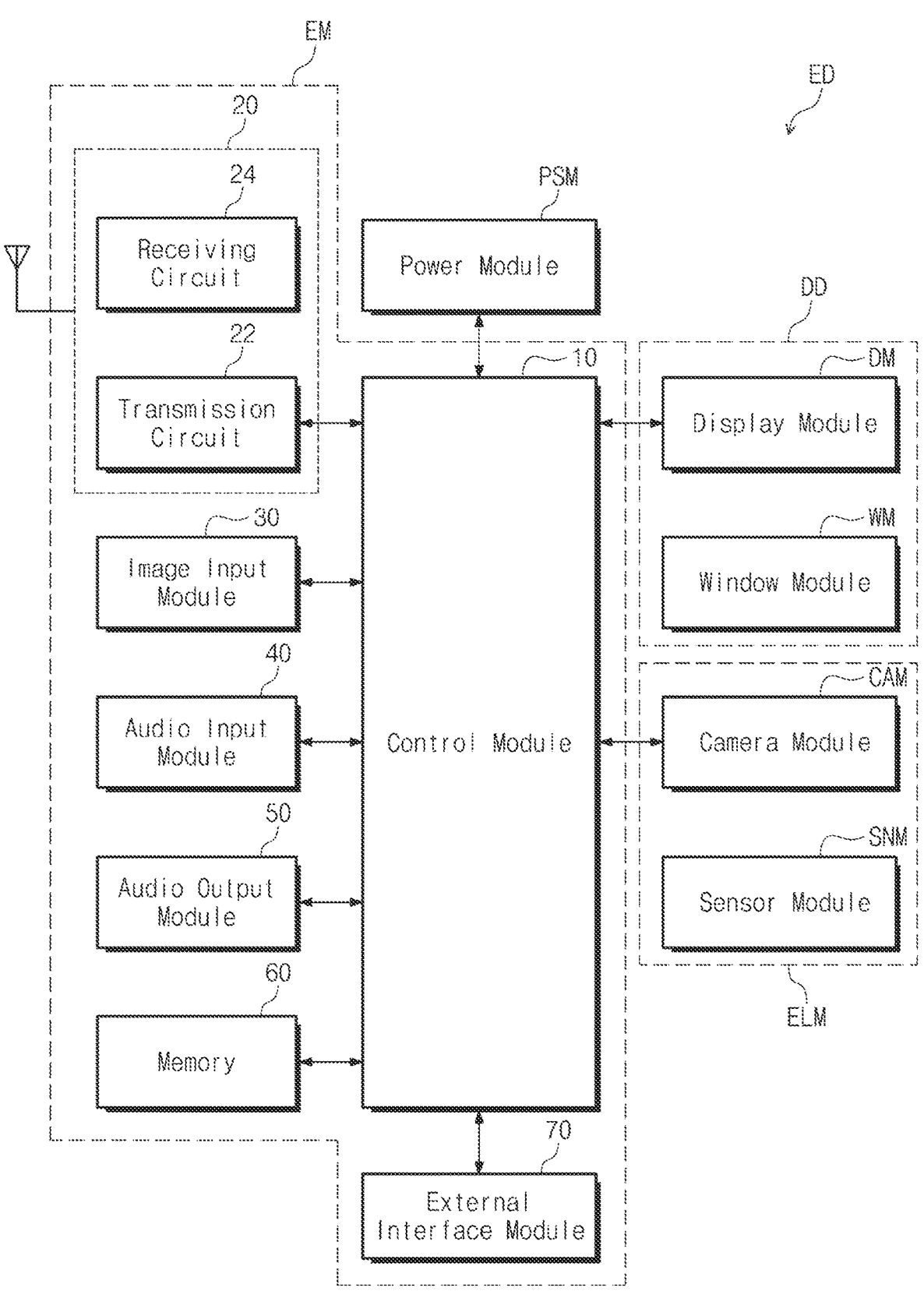
FIG. 7 is a block diagram of the electronic device of FIG. 6.

FIG. 7 is a block diagram of the electronic device ED of FIG. 6.

Referring to FIG. 7, the electronic device ED may include an electronic module EM, a power module PSM, a display device DD, and an electro-optical module ELM. The electronic module EM may include a control module 10, a wireless communication module 20, an image input module 30, an audio input module 40, an audio output module 50, a memory 60, and an external interface module 70. The modules may be mounted on a circuit board or electrically connected through a flexible circuit board. The electronic module EM may be electrically connected to the power module PSM.

The control module 10 may control an overall operation of the electronic device ED. For example, the control module 10 may activate or inactivate the display device DD according to an external input. The control module 10 may control the image input module 30, the audio input module 40, the audio output module 50, and the like in accordance with the external input. The control module 10 may include at least one microprocessor.

The wireless communication module 20 may transmit/ receive a wireless signal to/from the other terminal by using Bluetooth or Wi-Fi. The wireless communication module 20 may transmit/receive an audio signal by using a general communication line. The wireless communication module 20 includes a transmission circuit 22 modulating and transmitting a signal to be transmitted and a receiving circuit 24 demodulating the received signal.

The image input module 30 may process the image signal to convert the processed image signal into image data that is capable of being displayed on the display device DD. The audio input module 40 may receive external audio signals by using a microphone in a recording mode or voice recognition mode to convert the received audio signal into electrical sound data. The audio output module 50 may convert audio data received from the wireless communication module 20 or audio data stored in the memory 60 to output the converted audio data to the outside.

The external interface module 70 may serve as an interface connected to an external charger, a wired/wireless data port, and a card socket (for example, a memory card and an SIM/UIM card).

The power module PSM may supply power required for an overall operation of the electronic device ED. The power module PSM may include a battery device.

The electro-optical module ELM may be an electronic component that outputs or receives an optical signal. The electro-optical module ELM may transmit or receive an optical signal through a partial area of the display device DD. In this embodiment, the electro-optical module ELM may include a camera module CAM and a sensor module SNM. The camera module CAM may include the camera CA illustrated in FIG. 6. The sensor module SNM may include the sensor SN illustrated in FIG. 6.

Figure 8:
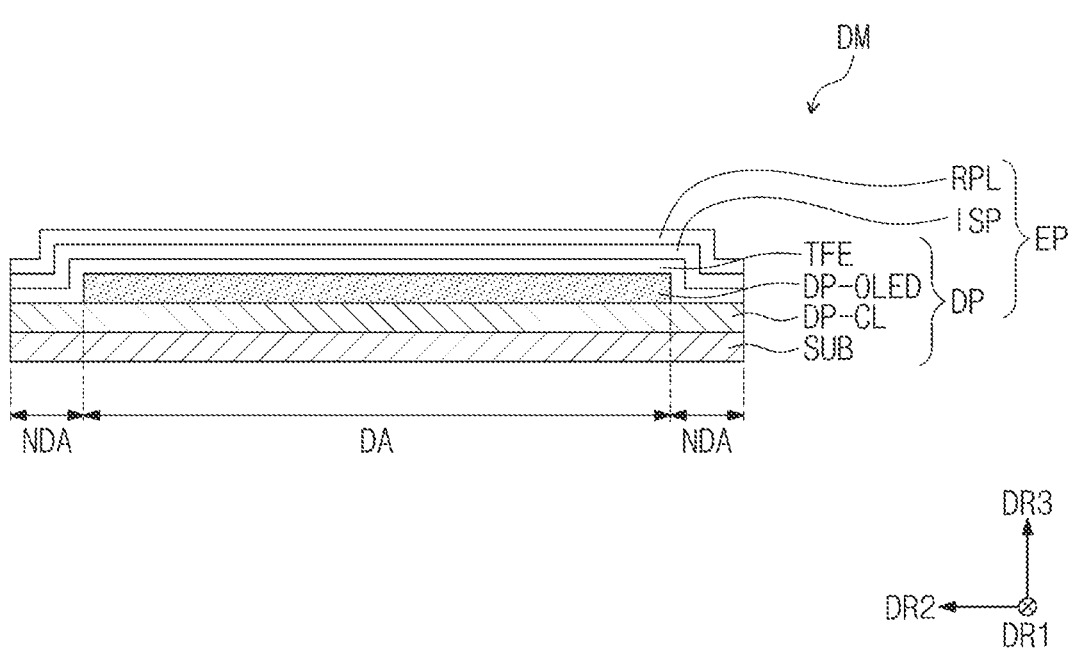
FIG. 8 is a schematic cross-sectional view illustrating a display module of FIG. 6.

FIG. 8 is a schematic cross-sectional view illustrating the display module DM of FIG. 6.

FIG. 8 illustrates a cross-sectional view illustrating an example of the display panel DP when viewed in the first direction DR1.

Referring to FIG. 8, the display module DM may include an electronic panel EP. The electronic panel EP may include a display panel DP, an input sensing part ISP disposed on the display panel DP, and an anti-reflection layer RPL disposed on the input sensing part ISP. The display panel DP may be a flexible display panel.

The display panel DP according to an embodiment of the invention may be an emission type display panel, but is not limited thereto. For example, the display panel DP may be an organic light emitting display panel or an inorganic light emitting display panel. An emission layer of the organic light emitting display panel may include an organic light emitting material. An emission layer of the inorganic light emitting display panel may include a quantum dot, a quantum rod, and the like. Hereinafter, the display panel DP is described as an organic light emitting display panel.

The display panel DP may include a substrate SUB, a circuit element layer DP-CL disposed on the substrate SUB, and a display element layer DP-OLED disposed on the circuit element layer DP-CL, and a thin film encapsulation layer TFE disposed on the display element layer DP-OLED.

The substrate SUB may include a display area DA and a non-display area NDA which is around (or adjacent to) the display area DA, like the display panel DP. The display element layer DP-OLED may be disposed on the display area DA. The substrate SUB may include a flexible plastic material. For example, the substrate SUB may include polyimide (PI).

The circuit element layer DP-CL may include transistors. The display element layer DP-OLED may include light emitting elements connected to the transistors. The configurations of the transistor and the light emitting device will be described in detail below with reference to FIG. 11.

The thin film encapsulation layer TFE may be disposed on the circuit element layer DP-CL to cover the display element layer DP-OLED. The thin film encapsulation layer TFE may protect the light emitting elements against foreign substances such as moisture/oxygen and dust particles.

The input sensing part ISP may be disposed on the thin film encapsulation layer TFE. The input sensing part ISP may include a plurality of sensors (not shown) that sense an external input. The sensors may sense the external input in a capacitive manner. The input sensing part ISP may be directly disposed on the thin film encapsulation layer TFE when the display module DM is manufactured. However, the embodiment of the invention is not limited thereto, and the input sensing part ISP may be provided as a separate panel and may be attached to the display panel DP by an adhesive layer.

The anti-reflection layer RPL may be disposed on the input sensing part ISP. The anti-reflection layer RPL may be directly disposed on the input sensing part ISP when the display module DM is manufactured. The anti-reflection layer RPL may be as an external light anti-reflection layer. The anti-reflection layer RPL may reduce reflectance of external light incident from the display device DD onto the display panel DP.

Figure 9:
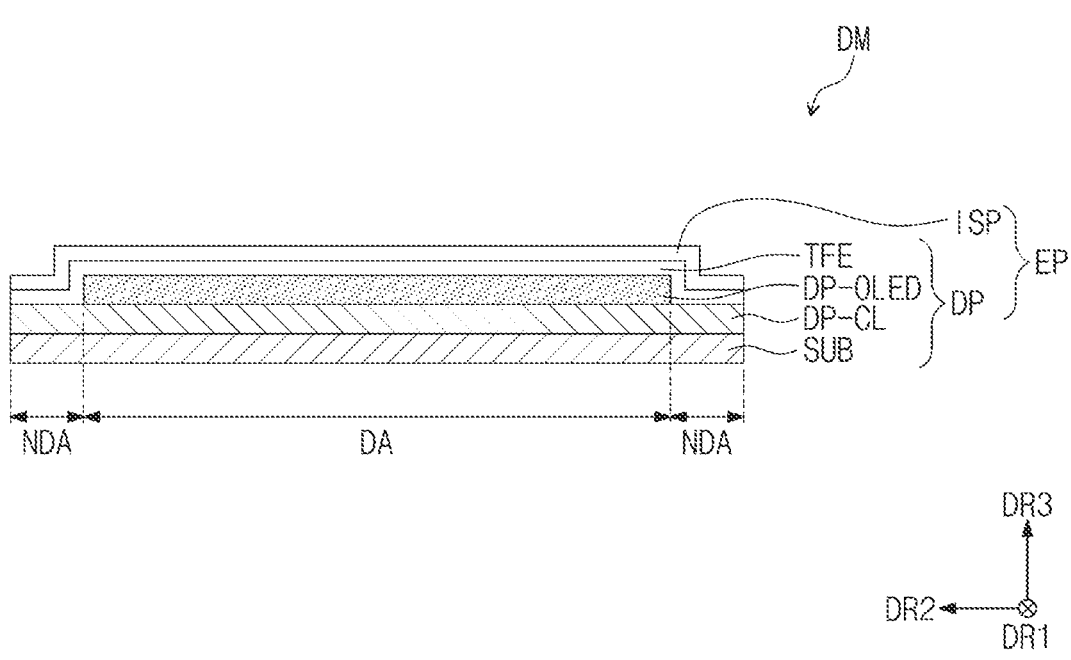
FIG. 9 is a schematic cross-sectional view of an electronic panel according to the invention, which has a structure different from that of the electronic panel of FIG. 8.

FIG. 9 is a schematic cross-sectional view of an electronic panel EP' according to the invention, which has a structure different from that of the electronic panel EP of FIG. 8.

Referring to FIG. 9, an electronic panel EP' may not include the anti-reflection layer RPL, unlike the electronic panel EP illustrated in FIG. 8. In FIG. 8, the anti-reflection layer RPL is disposed directly on the input sensing part ISP, but in FIG. 9, the anti-reflection layer RPL may not be disposed directly on the input sensing part ISP.

The anti-reflection layer RPL may be manufactured as a separate panel, disposed on the electronic panel EP', and attached to the electronic panel EP' by an adhesive layer. This configuration will be illustrated below in FIG. 19.

Figure 10:
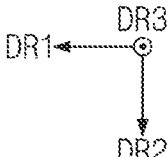
FIG. 10 is a plan view of the display panel of FIG. 6.

FIG. 10 is a plan view of the display panel DP of FIG. 6.

Referring to FIG. 10, the display module DM may include a display panel DP, a scan driver SDV, a data driver DDV, and an emission driver EDV.

The display panel DP may include a first area AA1, a second area AA2, and a bending area BA between the first area AA1 and the second area AA2. The bending area BA extends in the first direction DR1, and the first area AA1, the bending area BA, and the second area AA2 may be arranged in the second direction DR2.

The first area AA1 may include a display area DA and a non-display area NDA around the display area DA. The non-display area NDA may surround the display area DA. An image IM may be displayed on the display area DA but may not be displayed on the non-display area NDA. The second area AA2 and the bending area BA may be areas on which an image IM is not displayed.

When viewed in the first direction DR1, the first area AA1 may include a first non-folding area NFA1, a second non-folding area NFA2, and a folding area FA disposed between the first non-folding area NFA1 and the second non-folding area NFA2. The first and second non-folding areas NFA1 and NFA2 and the folding area FA may correspond to the first and second non-folding areas NFA1 and NFA2 and the folding area FA of the electronic device ED of FIG. 1, respectively. The first and second transmission areas HA' and HA2 may be defined on the display area DA and the second non-folding area NFA2.

The first area AA1 may be bent and folded with respect to the above-described folding axis FX. For example, as the folding area FA of the first area AA1 is folded with respect to the above-described folding axis FX, the display panel DP may be folded.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, a plurality of connection lines CNL, and a plurality of pads PD. Here, 'm' and 'n' are natural numbers. The pixels PX may be disposed on the display area DA and connected to the scan lines SL1 to SLm, the data lines DL1 to DLn, and the emission lines EL1 to ELm.

A scan driver SDV and an emission driver EDV may be disposed on the non-display area NDA. The scan driver SDV and the emission driver EDV may be disposed on the non-display area NDA adjacent to respective sides of the first area AA1, which are opposite to each other in the first direction DR1. The data driver DDV may be disposed on the second area AA2. The data driver DDV may be manufactured in the form of an integrated circuit chip and mounted on the second area AA2.

The scan lines SL1 to SLm may extend in the first direction DR1 and be connected to the scan driver SDV. The data lines DL1 to DLn may extend in the second direction DR2 and be connected to the data driver DDV, via the bending area BA. The data driver DDV may be connected to the pixels PX through the data lines DL1 to DLn. The data driver DDV may be defined as a driver. The emission lines EL1 to ELm may extend in the first direction DR1 and be connected to a gate driver EDV.

The power line PL may extend in the second direction DR2 and be disposed on the non-display area NDA. The power line PL may be disposed between the display area DA and the emission driver EDV, but is not limited thereto. For example, the power line PL may be disposed between the display area DA and the scan driver SDV.

The power line PL may extend to the second area AA2 via the bending area BA. The power line PL may extend toward a lower end of the second area AA2 when viewed on a plane. The power line PL may receive a driving voltage.

The connection lines CNL may extend in the first direction DR1 and may be arranged in the second direction DR2. The connection lines CNL may be connected to the power line PL and the pixels PX. The driving voltage may be applied to the pixels PX through the power line PL and the connection lines CNL, which are connected to each other.

The first control line CSL1 may be connected to the scan driver SDV and extend toward the lower end of the second area AA2 via the bending area BA. The second control line CSL2 may be connected to the emission driver EDV and extend toward the lower end of the second area AA2 via the bending area BA. The data driver DDV may be disposed between the first control line CSL1 and the second control line CSL2.

When viewed on the plane, the pads PD may be disposed adjacent to the lower end of the second area AA2. The data driver DDV, the power line PL, the first control line CSL1, and the second control line CSL2 may be connected to the pads PD.

The data lines DL1 to DLn may be connected to corresponding pads PD through the data driver DDV. For example, the data lines DL1 to DLn may be connected to the data driver DDV, and the data drivers DDV may be connected to the pads PD, which respectively correspond to the data lines DL1 to DLn.

Although not shown, a printed circuit board PCB as an external component may be connected to the pads PD, and a timing controller and a voltage generator may be disposed on the printed circuit board PCB. The timing controller may be manufactured as an integrated circuit chip and mounted on the printed circuit board PCB. The timing controller and the voltage generator may be connected to the display panel DP, at the pads PD, through the printed circuit board PCB.

The timing controller may control operations of the scan driver SDV, the data driver DDV, and the emission driver EDV. The timing controller may generate a scan control signal, a data control signal, and an emission control signal in response to control signals received from the outside. The voltage generator may generate the driving voltage.

The scan control signal may be provided to the scan driver SDV through the first control line CSL1. The emission control signal may be provided to the emission driver EDV through the second control line CSL2. The data control signal may be provided to the data driver DDV. The timing controller may receive image signals from the outside and convert a data format of the image signals to match an interface specification with the data driver DDV and thus provide the converted data format to the data driver DDV.

The scan driver SDV may generate a plurality of scan signals in response to scan control signals. The scan signals may be applied to the pixels PX through the scan lines SL1 to SLm. The scan signals may be sequentially applied to the pixel PX.

The data driver DDV may generate a plurality of data voltages corresponding to image signals in response to data control signals. The data voltages may be provided to the pixels PX through the data lines DL1 to DLn. The emission driver EDV may generate a plurality of emission signals in response to emission signals. The emission signals may be applied to the pixels PX through the emission lines EL1 to ELm.

The pixels PX may receive the data voltages in response to the scan signals. The pixels PX may emit light having luminance corresponding the data voltages in response to the emission signals to display an image. An emission time of the pixels PX may be controlled by the emission signals.

Figure 11:
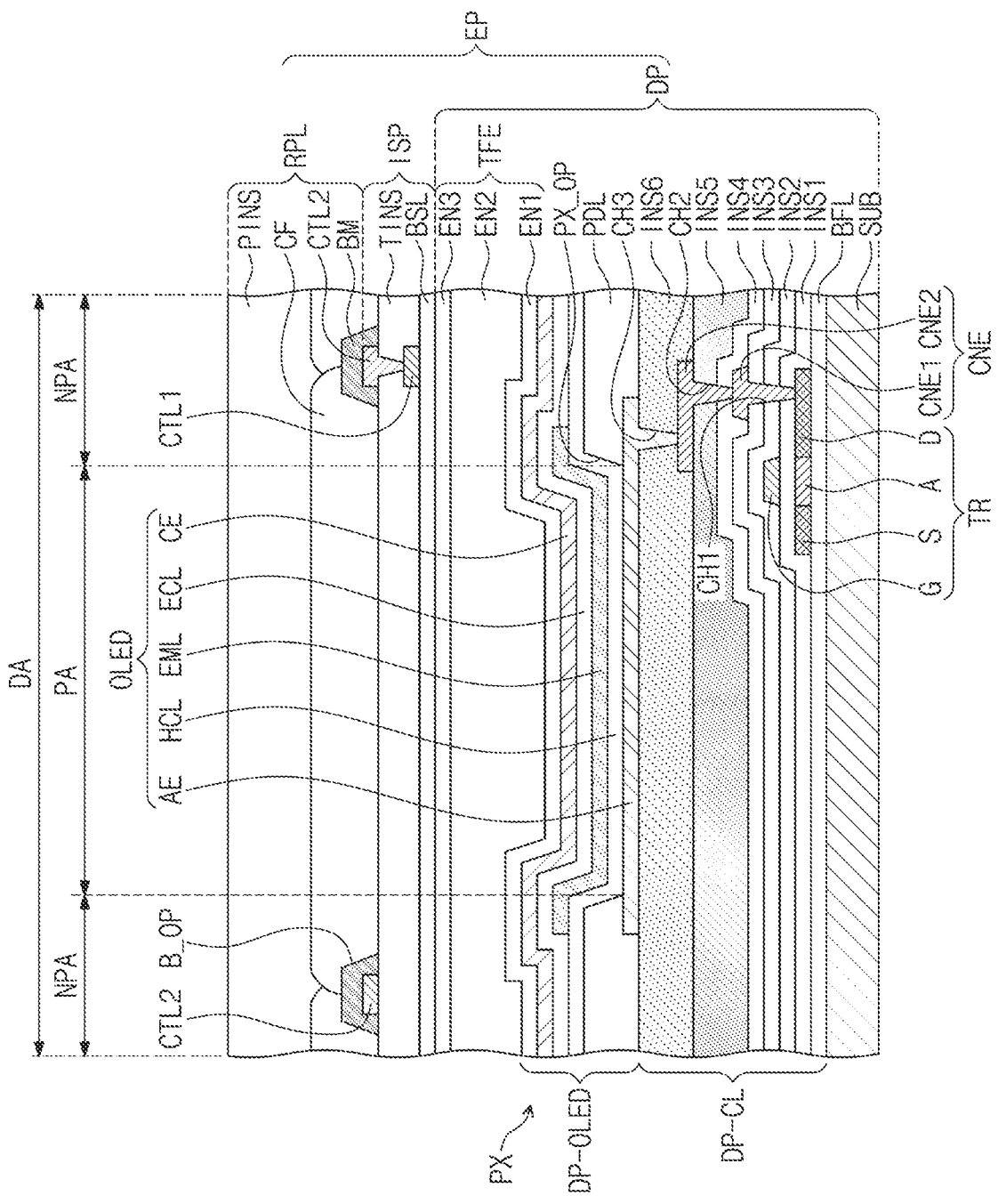
FIG. 11 is a view illustrating an example of a cross-section of the electronic panel corresponding to one pixel of FIG. 10.

FIG. 11 is a view illustrating an example of a cross-section of the electronic panel EP corresponding to a pixel PX of FIG. 10.

The cross-section of FIG. 11 may be the cross-section of the electronic panel EP of FIG. 8.

Referring to FIG. 11, the pixel PX may include a transistor TR and a light emitting element OLED. The light emitting element OLED may include a first electrode AE (or anode), a second electrode CE (or cathode), a hole control layer HCL, an electron control layer ECL, and an emission layer EML.

The transistor TR and the light emitting element OLED may be disposed on the substrate SUB. For example, one transistor TR is illustrated, but substantially, the pixel PX may include a plurality of transistors and at least one capacitor, which drive the light emitting element OLED.

The display area DA may include an emission area PA (e.g., light emission area) corresponding to each of the pixels PX, and a non-emission area NPA around the emission area PA. The light emitting element OLED may be disposed on the emission area PA.

A buffer layer BFL may be disposed on the substrate SUB, and the buffer layer BFL may be an inorganic layer. A semiconductor pattern may be disposed on the buffer layer BFL. The semiconductor pattern may include polysilicon, amorphous silicon, or metal oxide.

The semiconductor pattern may be doped with an N-type dopant or a P-type dopant. The semiconductor pattern may include a highly doped region and a lowly doped region. The highly doped region may have conductivity greater than that of the lowly doped region to substantially serve as a source electrode and a drain electrode of the transistor TR. The lowly doped region may substantially correspond to an active (or channel) of the transistor.

A source S, an active A (e.g., active region), and a drain D of the transistor TR may be formed from the semiconductor pattern. A first insulating layer INS1 may be disposed on the semiconductor pattern. The gate G of the transistor TR may be disposed on the first insulating layer INS1. A second insulating layer INS2 may be disposed on the gate G. A third insulating layer INS3 may be disposed on the second insulating layer INS2.

The connection electrode CNE may include a first connection electrode CNE1 and a second connection electrode CNE2 to connect the transistor TR to the light emitting element OLED. The first connection electrode CNE1 may be disposed on the third insulating layer INS3 and be connected to the drain D through a first contact hole CH1 defined in the first to third insulating layers INS1 to INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through the second contact hole CH2 defined in the fourth and fifth insulating layers INS4 and INS5.

A sixth insulating layer INS6 may be disposed on the second connection electrode CNE2. A collective layer provided from the buffer layer BFL to the sixth insulating layer INS6 may be defined as the circuit element layer DP-CL. Each of the first insulating layer INS1 to the sixth insulating layer INS6 may be an inorganic layer or an organic layer.

The first electrode AE may be disposed on the sixth insulating layer INS6. The first electrode AE may be connected to the second connection electrode CNE2 through a third contact hole CH3 defined in the sixth insulating layer INS6. A pixel defining layer PDL, in which a pixel opening PX_OP for exposing a portion of the first electrode AE to outside the pixel defining layer PDL is defined, may be disposed on the first electrode AE and the sixth insulating layer INS6.

The hole control layer HCL may be disposed on the first electrode AE and the pixel defining layer PDL. The hole control layer HCL may include a hole transport layer and a hole injection layer.

The emission layer EML may be disposed on the hole control layer HCL. The emission layer EML may be disposed on an area corresponding to the pixel opening PX_OP. The emission layer EML may include an organic material and/or an inorganic material. The emission layer EML may emit one of red light, green light, and blue light.

The electron control layer ECL may be disposed on the hole control layer HCL to cover the emission layer EML. The electron control layer ECL may include an electron transport layer and an electron injection layer. A hole control layer HCL and an electron control layer ECL may be commonly disposed on the emission area PA and the non-emission area NPA.

The second electrode CE may be disposed on the electron control layer ECL. The second electrode CE may be commonly disposed in the pixels PX. The collective layer in which the light emitting element OLED is disposed may be defined as the display element layer DP-OLED.

The thin film encapsulation layer TFE may be disposed on the second electrode CE to cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

Each of the first and third encapsulation layers EN1 and EN3 may include an inorganic insulating layer and may protect the pixel PX against moisture/oxygen. The second encapsulation layer EN2 may include an organic insulating layer and may protect the pixel PX against foreign substances such as dust particles.

A first voltage may be applied to the first electrode AE through the transistor TR, and a second voltage having a level lower than that of the first voltage may be applied to the second electrode CE. Holes and electrons injected into the light emitting layer EML may be coupled to each other to form an exciton. While the exciton may be transitioned to a ground state, the light emitting element OLED may emit light.

The input sensing part ISP may be disposed on the thin film encapsulation layer TFE. The input sensing part ISP may be manufactured (or provided) directly on a top surface of the thin film encapsulation layer TFE. As being 'directly on' each other, elements may form an interface therebetween, without being limited thereto.

A base layer BSL may be disposed on the thin film encapsulation layer TFE. The base layer BSL may include an inorganic insulating layer. At least one inorganic insulating layer may be provided on the thin film encapsulation layer TFE as the base layer BSL.

The input sensing part ISP may include a first conductive pattern CTL1 and a second conductive pattern CTL2 which is disposed on the first conductive pattern CTL1. The first conductive pattern CTL1 may be disposed on the base layer BSL. An insulating layer TINS may be disposed on the base layer BSL to cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap the non-emission area NPA. Although not shown, the first and second conductive patterns CTL1 and CTL2 may be disposed on the non-emission area NPA between the emission areas PA and may have a mesh shape. The mesh shape may be defined by solid portions of a material layer which are spaced apart from each other, without being limited thereto.

The first and second conductive patterns CTL1 and CTL2 may form sensors of the above-described input sensing part ISP. For example, the mesh-shaped first and second conductive patterns CTL1 and CTL2 may be separated from each other in a predetermined region to form the sensors. A portion of the second conductive pattern CTL2 may be connected to the first conductive pattern CTL1.

An anti-reflection layer RPL may be disposed on the second conductive pattern CTL2. The anti-reflection layer RPL may include a black matrix BM as a light blocking pattern, and a plurality of color filters CF as a color filter layer. The black matrix BM may overlap the non-emission area NPA, and the color filters CF may overlap the emission areas PA, respectively.

The black matrix BM may be disposed on the insulating layer TINS to cover the second conductive pattern CTL2. An emission opening B_OP overlapping the emission area PA and the pixel opening PX_OP may be defined in the black matrix BM. The black matrix BM may absorb and block light. Elements may have a width in a direction along an underlying layer. For example, the emission opening B_OP and the pixel opening PX_OP may each have a width in a direction along the substrate SUB. The width of the emission opening B_OP may be greater than the width of the pixel opening PX_OP.

The color filters CF as color filter patterns may be disposed on the first insulating layer TINS and the black matrix BM. The color filters CF may be respectively disposed in the emission openings B_OP. A planarization insulating layer PINS may be disposed on the color filters CF. The planarization insulating layer PINS may provide a flat top surface.

When external light traveling toward the display panel DP from outside the electronic device ED is reflected from the display panel DP and provided again to outside of the electronic device ED, the reflected external light may be recognized from outside the electronic device ED, like a mirror. To prevent this phenomenon, for example, the anti-reflection layer RPL may include a plurality of color filters CF displaying the same color as the pixels PX of the display panel DP. The color filters CF may filter external light with the same colors as the pixels PX. In this case, the external light may not be visually recognized from outside electronic device ED.

Figure 12:
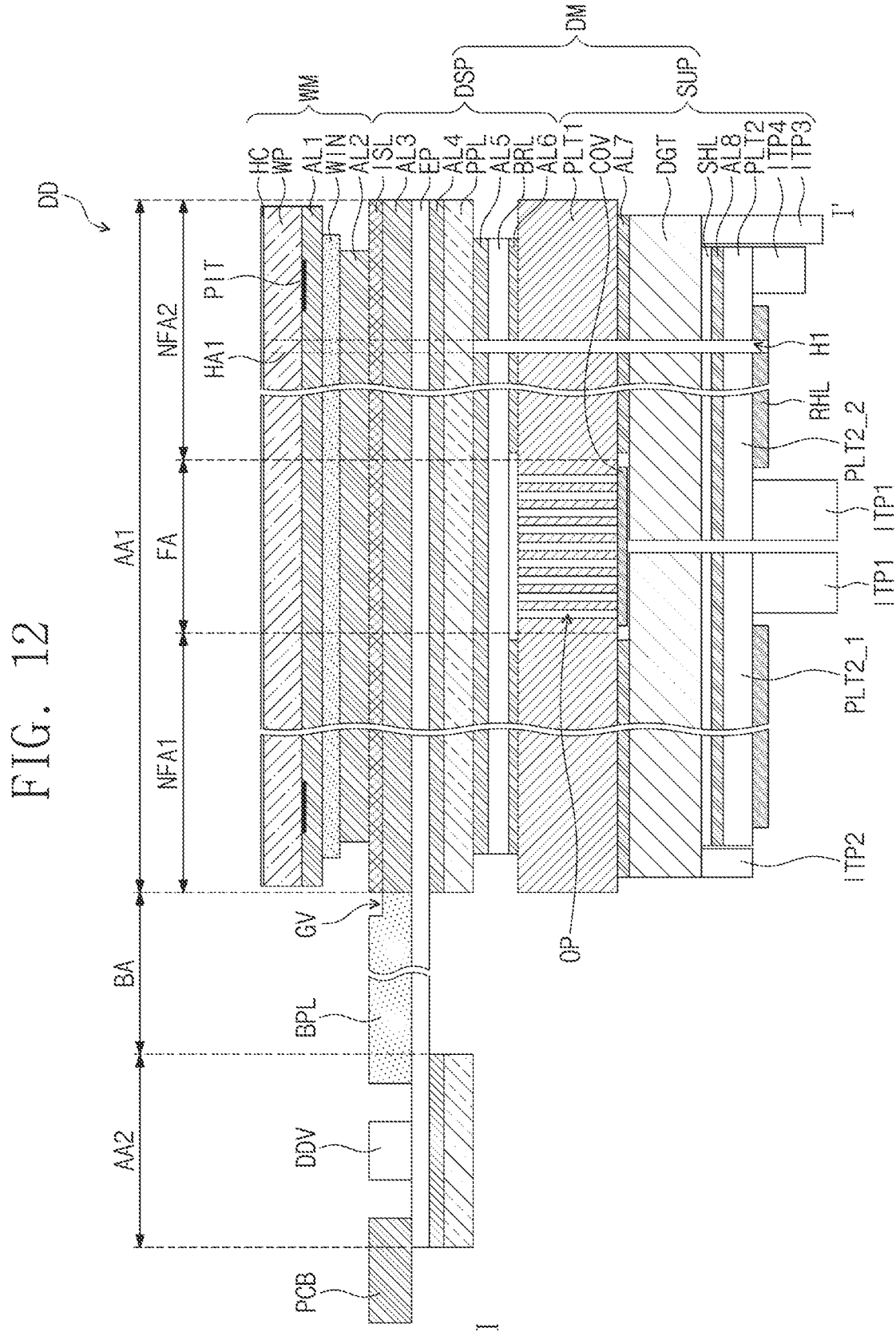
FIG. 12 is a cross-sectional view taken along line I-I' of FIG. 10.
Figure 13:
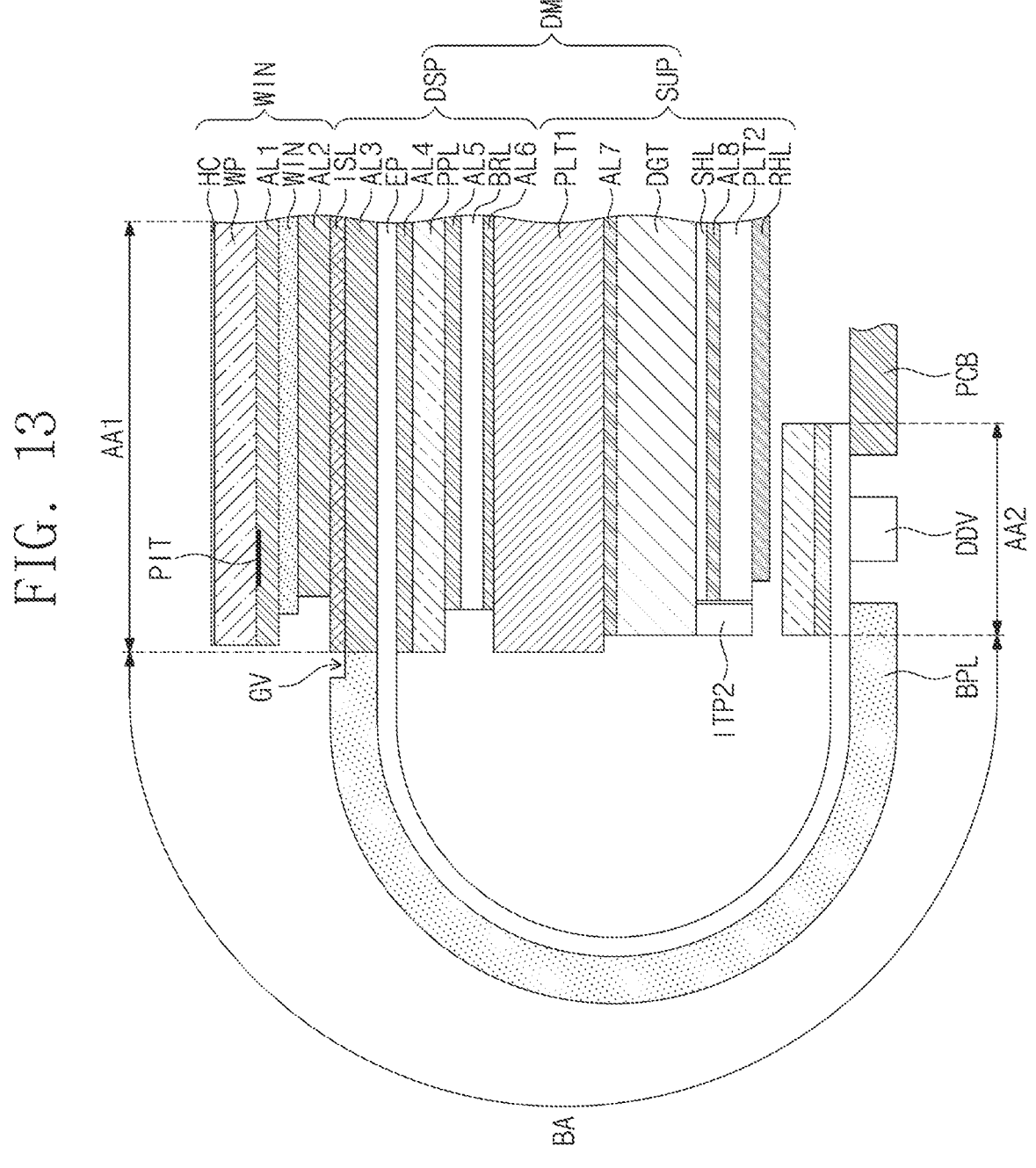
FIG. 13 is a view illustrating a state in which a bending area of FIG. 1 is bent.

FIG. 12 is a cross-sectional view taken along line I-I' of FIG. 10. FIG. 13 is a view illustrating a state in which a bending area BA of FIG. 1 is bent.

For example, in FIG. 12, a cross-section of the display module DM and a cross-section of the window module WM, which correspond to the line I-I", are illustrated together.

Referring to FIG. 12, the display device DD may include the display module DM, and the window module WM disposed on the display module DM. The window module WM may be disposed on the display module DM to protect the display module DM.

The display module DM may be a flexible display module. The display module DM may include a first non-folding area NFA1, a folding area FA, and a second non-folding area NFA2. The display module DM may include a display part DSP and a support part SUP. The support part SUP may be disposed under the display part DSP to support the display part DSP.

The window module WM may include a window WIN, a window protective layer WP, a hard coating layer HC, and first and second adhesive layers AL1 and AL2. The display part DSP may include an electronic panel EP, an impact absorption layer ISL, a panel protective layer PPL, a barrier layer BRL, and third to fifth adhesive layers AL3 to AL5.

The electronic panel EP may be the electronic panel EP illustrated in FIG. 8. Like the display panel DP, the electronic panel EP may include a first area AA1, a second area AA2, and a bending area BA between the first area AA1 and the second area AA2. Since the configurations of the electronic panel EP has been described in detail with reference to FIG. 8, descriptions thereof will be omitted.

The impact absorption layer ISL may be disposed on the electronic panel EP. The impact absorption layer ISL may protect the electronic panel EP by absorbing an external impact applied from the upper side of the display device DD toward the electronic panel EP. The impact absorption layer ISL may be manufactured in the form of a stretched film.

The impact absorption layer ISL may include a flexible plastic material. The flexible plastic material may be defined as a synthetic resin film. For example, the impact absorption layer ISL may include a flexible plastic material such as polyimide (PI) or polyethylene terephthalte (PET).

The window WIN may be disposed on the impact absorption layer ISL. The window WIN may protect the electronic panel EP from external scratches. The window WIN may have optically transparent properties. The window WIN may include glass. However, the embodiment of the invention is not limited thereto, and the window WIN may include a synthetic resin film.

The window WIN may have a single-layer or multi-layer structure. For example, the window WIN may include a plurality of plastic films bonded to each other by using an adhesive or include a glass substrate and a plastic film, which are bonded to each other by using an adhesive.

The window protective layer WP may be disposed on the window WIN. The window protective layer WP may include a flexible plastic material such as polyimide or polyethylene terephthalate. The hard coating layer HC may be disposed on a top surface of the window protective layer WP.

A printed layer PIT as a printed pattern may be disposed on a bottom surface of the window protective layer WP. The printed layer PIT may have a black color, but the color of the printed layer PIT is not limited thereto. The printed layer PIT may be adjacent to an edge of the window protective layer WP.

The panel protective layer PPL may be disposed below the display panel DP. The panel protective layer PPL may protect a lower portion of the display panel DP. The panel protective layer PPL may include a flexible plastic material. For example, the panel protective layer PPL may include polyethylene terephthalate (PET).

The barrier layer BRL may be disposed below the panel protective layer PPL. Resistance to compression force due to external pressing may increase by the barrier layer BRL. The barrier layer BRL may serve to prevent deformation of the electronic panel EP from occurring. The barrier layer BRL may include a flexible plastic material such as polyimide or polyethylene terephthalate.

The barrier layer BRL may have a color that absorbs light. For example, the barrier layer BRL may have a black color. In this case, when viewing the display module DM from an upper side of the display module DM, components disposed below the barrier layer BRL may not be visually recognized.

The first adhesive layer AL1 may be disposed between the window protective layer WP and the window WIN. The window protective layer WP and the window WIN may be bonded to each other by the first adhesive layer AL1. The first adhesive layer AL1 may cover the printed layer PIT.

The second adhesive layer AL2 may be disposed between the window WIN and the impact absorption layer ISL. The window WIN and the impact absorption layer ISL may be bonded to each other by the second adhesive layer AL2.

The third adhesive layer AL3 may be disposed between the impact absorption layer ISL and the electronic panel EP. The impact absorption layer ISL and the electronic panel EP may be bonded to each other by the third adhesive layer AL3.

A fourth adhesive layer AL4 may be disposed between the electronic panel EP and the panel protective layer PPL. The electronic panel EP and the panel protective layer PPL may be bonded to each other by the fourth adhesive layer AL4.

The fifth adhesive layer AL5 may be disposed between the panel protective layer PPL and the barrier layer BRL. The panel protective layer PPL and the barrier layer BRL may be bonded to each other by the fifth adhesive layer AL5.

The sixth adhesive layer AL6 may be disposed between the barrier layer BRL and the first support plate PLT1. The barrier layer BRL and the first support plate PLT1 may be bonded to each other by the sixth adhesive layer AL6.

Hereinafter, in this specification, a "thickness" may indicate a value measured in the third direction DR3, and a "width" may indicate a value measured in the first direction DR1 or the second direction DR2, which is a horizontal direction.

The sixth adhesive layer AL6 may overlap the first and second non-folding areas NFA1 and NFA2 and may not overlap the folding area FA. That is, the sixth adhesive layer AL6 may be opened in the folding area FA or disconnected at the folding area FA.

Each of the first to sixth adhesive layers AL1 to AL6 may include a transparent adhesive such as a pressure sensitive adhesive (PSA) or an optically clear adhesive (OCA), but the type of adhesive is not limited thereto.

A thickness of the panel protective layer PPL may be less than that of the window protective layer WP, and a thickness of the barrier layer BRL may be less than that of the panel protective layer PPL. A thickness of the electronic panel EP may be less than that of the barrier layer BRL and may be the same as that of the window WIN. A thickness of the impact absorption layer ISL may be less than that of the electronic panel EP.

A thickness of the first adhesive layer AL1 may be the same as that of the barrier layer BRL, and a thickness of each of the second adhesive layer AL2 and the third adhesive layer AL3 may be the same as that of the panel protective layer PPL. A thickness of the fourth adhesive layer AL4 may be the same as that of the fifth adhesive layer AL5.

Each of the fourth and fifth adhesive layers AL4 and AL5 may have a thickness less than that of the electronic panel EP and greater than that of the impact absorption layer ISL. A thickness of the sixth adhesive layer AL6 may be less than that of the impact absorption layer ISL. A thickness of the hard coating layer HC may be less than that of the sixth adhesive layer AL6.

The electronic panel EP, the impact absorption layer ISL, the panel protective layer PPL, and the third and fourth adhesive layers AL3 and AL4 may have the same width or correspond to a same width. In FIG. 12, the width of the electronic panel EP may be defined as a width of a portion of the electronic panel EP disposed on the first area AA1. The window protective layer WP and the first adhesive layer AL1 may have the same width. The barrier layer BRL and the fifth and sixth adhesive layers AL5 and AL6 may have the same width.

Each of the widths of the electronic panel EP, the impact absorption layer ISL, the panel protective layer PPL, and the third and fourth adhesive layers AL3 and AL4 may be greater than that of each of the window protective layer WP and the first adhesive layer AL1. Edges of the electronic panel EP, the impact absorption layer ISL, the panel protective layer PPL, and the third and fourth adhesive layers AL3 and AL4 may be disposed outside edges of the window protective layer WP and the first adhesive layer AL1.

A width of each of the window WIN and the second adhesive layer AL2 may be less than that of each of the window protective layer WP and the first adhesive layer AL1. The width of the second adhesive layer AL2 may be less than that of the window WIN. The edge of the window WIN may be disposed inside the edge of each of the window protective layer WP and the first adhesive layer AL1. The edge of the second adhesive layer AL2 may be disposed inside the edge of the window WIN.

A width of each of the barrier layer BRL and the fifth and sixth adhesive layers AL5 and AL6 may be less than that of each of the window protective layer WP and the first adhesive layer AL1. Edges of the barrier layer BRL and the fifth and sixth adhesive layers AL5 and AL6 may be disposed inside the edges of the window protective layer WP and the first adhesive layer AL1.

The support part SUP may include a first support plate PLT1, a second support plate PLT2, a cover layer COV, a digitizer DGT, a shielding layer SHL, a heat dissipation layer RHL, seventh and eighth adhesive layers AL7 and ALB, and a plurality of first to fourth insulating tapes ITP1 to ITP4.

The first support plate PLT1 may be disposed under the electronic panel EP to support the electronic panel EP. The first support plate PLT1 may be disposed under the barrier layer BRL.

The first support plate PLT1 may have rigidity greater than that of a rigidity of the display part DSP. The first support plate PLT1 may include a non-metal material. For example, the first support plate PLT1 may include a reinforcing fiber composite. For example, the reinforcing fiber composite may be carbon fiber reinforced plastic (CFRP) or glass fiber reinforced plastic (GFRP).

The first support plate PLT1 may include a reinforcing fiber composite so as to be lightweight. The first support plate PLT1 according to an embodiment may include a reinforcing fiber composite material and thus have a light weight compared to the metal support plate using a metal material and have a modulus and strength similar to that of the metal support plate.

Since the first support plate PLT1 may include the reinforcing fiber composite, the shape processing of the first support plate PLT1 may be easier compared to the metal support plate. For example, the first support plate PLT1 including the reinforcing fiber composite may be more easily processed through a laser process or a micro-blast process.

A plurality of openings OP may be defined in a portion of the first support plate PLT1 overlapping the folding area FA. The openings OP may be defined to pass through portions of the first support plate PLT1 in the third direction DR3, and may be open at both upper and lower surfaces of the first support plate PLT1. The openings OP may be formed through the above-described laser process or micro-blast process.

Since the openings OP are defined in the portion of the first support plate PLT1 overlapping the folding area FA, flexibility of the portion of the first support plate PLT1, which overlaps the folding area FA, may increase. As a result, the first support plate PLT1 may be easily folded with respect to the folding area FA. A more detailed configuration of the openings OP will be described in detail below.

The cover layer COV may be disposed under the first support plate PLT1. The cover layer COV may cover the openings OP defined in the first support plate PLT1 under the first support plate PLT1. The cover layer COV may overlap the folding area FA and may not overlap the first and second non-folding areas NFA1 and NFA2. That is, the cover layer COV may not be disposed on the first and second non-folding areas NFA1 and NFA2. The cover layer COV may be in contact with a bottom surface of a portion of the first support plate PLT1 in which the openings OP are defined. As being in contact, elements may form an interface with each other, without being limited thereto.

The cover layer COV may have an elastic modulus less than that of the first support plate PLT1. For example, the cover layer COV may include thermoplastic polyurethane or rubber, but the material of the cover layer COV is not limited thereto. The cover layer COV may be manufactured in the form of a sheet and attached to the first support plate PLT1.

The digitizer DGT may be disposed under the first support plate PLT1. The cover layer COV may be disposed between the first support plate PLT1 and the digitizer DGT. The cover layer COV may be spaced apart from a top surface of the digitizer DGT which is closest to the display part DSP.

The digitizer DGT may be a device that receives location information of an external input relative to the display surface DS. The digitizer DGT may be implemented in an electromagnetic manner (or electromagnetic resonance manner). For example, the digitizer DGT may include a digitizer sensor substrate (not shown) including a plurality of coils. However, the embodiment of the invention is not limited thereto, and the digitizer DGT may be implemented as an active electrostatic type.

When an input tool, such as a pen, is moved along the display device DD, the pen may be driven by an alternating current (AC) signal to generate vibrating magnetic fields, and the vibrating magnetic fields may induce a signal in the coil. The position of the pen may be detected through the signal induced in the coil. The digitizer DGT may sense the position of the pen by detecting an electromagnetic change generated by the approach of the pen.

If the first support plate PLT1 disposed on the digitizer DGT and adjacent to the digitizer DGT includes a metal, sensitivity of the digitizer DGT may be lowered by the metal. For example, when a signal transmitted on the display device DD is blocked due to a signal interference by the metal support plate, the digitizer DGT may not operate normally. However, in an embodiment of the invention, since the first support plate PLT1 disposed on the digitizer DGT includes a non-metal reinforcing fiber composite, the digitizer DGT may operate normally.

The digitizer DGT may be divided into two portions at the folding area FA which are spaced apart from each other. The portions of the digitizer DGT, which are separated from each other, may be connected to a digitizer driver (not shown) through flexible circuit boards.

The shielding layer SHL may be disposed under the digitizer DGT. The shielding layer SHL may include a metal. For example, the shielding layer SHL may include copper, but the metal material of the shielding layer SHL is not limited thereto. The shielding layer SHL may be divided into two portions on the folding area FA. The portions of the shielding layer SHL, which are separated from each other, may be disposed under the portions of the digitizer DGT, which are separated from each other, respectively.

The shielding layer SHL may shield electromagnetic waves that may be applied to the digitizer DGT under the display device DD. The shielding layer SHL may be defined as an electromagnetic shielding layer. The shielding layer SHL including a metal may serve as a heat dissipation layer.

The second support plate PLT2 may be disposed under the shielding layer SHL. The second support plate PLT2 may have rigidity greater than that of the display part DSP. The second support plate PLT2 may include a metal material such as stainless steel (e.g., SUS 316), but the metal material of the second support plate PLT2 is not limited thereto. Also, the embodiment of the invention is not limited thereto, and the second support plate PLT2 may include a non-metal material such as plastic.

The second support plate PLT2 may be divided into two portions at the folding area FA. For example, the second support plate PLT2 may include a second_1 support plate PLT2_1 overlapping the first non-folding area NFA1 and a second_2 support plate PLT2_2 overlapping the second non-folding area NFA2.

The second_1 support plate PLT2_1 may support the first non-folding area NFA1. The second_2 support plate PLT2_2 may support the second non-folding area NFA2. The second_1 support plate PLT2_1 and the second_2 support plate PLT2_2 may each extend to the folding area FA and be disposed adjacent to each other at the folding area FA. The second_1 support plate PLT2_1 and the second_2 support plate PLT2_2 may be spaced apart from each other (e.g., disconnected from each other) under the folding area FA.

The second_1 support plate PLT2_1 and the second_2 support plate PLT2_2 may support a portion of the first support plate PLT1, in which the openings OP are defined, under the folding area FA. For example, when a pressure is applied to the first support plate PLT1 from the top, deformation of the portion of the first support plate PLT1, in which the openings OP are defined, may be prevented by the second_1 support plate PLT2_1 and the second_2 support plate PLT2_2. Additionally, the second_1 and second_2 support plates PLT2_1 and PLT2_2 may perform a heat dissipation function.

The heat dissipation layer RHL may be disposed under the second support plate PLT2. The heat dissipation layer RHL may be divided into two portions at the folding area FA. The portions of the heat dissipation layer RHL, which are separated from each other, may be respectively disposed under the second_1 and second_2 support plates PLT2_1 and PLT2_2.

The heat dissipation layer RHL may perform a heat dissipation function. For example, the heat dissipation layer RHL may include graphite, but the material of the heat dissipation layer RHL is not limited thereto. As the heat dissipation layer RHL performs the heat dissipation function together with the second support plate PLT2 and the shielding layer SHL, heat dissipation performance of the display device DD may be improved.

First to fourth insulating tapes ITP1 to ITP4 may be disposed under the digitizer DGT and the second support plate PLT2. Each of the first to fourth insulating tapes ITP1 to ITP4 may include an insulating material.

The two first insulating tapes ITP1 may be disposed to be adjacent to one side of the second_1 support plate PLT2_1 and one side of the second_2 support plate PLT2_2, which face each other at the folding area FA, and also may be disposed below the second_1 support plate PLT2_1 and the second_2 support plate PLT2_2.

The second insulating tape ITP2 and the third insulating tape ITP3 may be disposed under the digitizer DGT adjacent to both sides of the digitizer DGT, respectively. The second insulating tape ITP2 may be adjacent to the edge of the second_1 support plate PLT2_1, and the third insulating tape ITP3 may be adjacent to the edge of the second_2 support plate PLT2_2.

The fourth insulating tape ITP4 may be disposed to be adjacent to the other side of the second_2 support plate PLT2_2, which is opposite to the one side of the second_2 support plate PLT2_2. The fourth insulating tape ITP4 may be disposed under the second_2 support plate PLT2_2.

The shielding layer SHL, the second support plate PLT2, the heat dissipation layer RHL, the first insulating tapes ITP1, and the fourth insulating tape ITP4 may be disposed between the second insulating tape ITP2 and the third insulating tape ITP3. One of the heat dissipation layers RHL separated from each other may be disposed between the first insulating tape ITP1 and the fourth insulating tape ITP4, which are disposed under the second_2 support plate PLT2_2. The other of the heat dissipation layers RHL separated from each other may be disposed between the first insulating tape ITP1 disposed under the second_2 support plate PLT2_1 and the second insulating tape ITP2 disposed under the digitizer DGT.

Although not shown, magnets may be disposed under the display module DM to maintain the folded state when the electronic device ED is folded. The magnets may be adjacent to the edge of the electronic device ED. The folded state of the electronic device ED may be maintained by magnetic force of the magnets.

When magnetism of the magnets is transferred to the digitizer DGT, the digitizer DGT may not operate normally. The first to fourth insulating tapes ITP1 to ITP4 may prevent the magnetism of the magnets disposed on the edge of the electronic device ED from being transmitted to the digitizer DGT. The first to fourth insulating tapes ITP1 to ITP4 may be defined as magnetic shielding tapes.

The seventh adhesive layer AL7 may be disposed between the first support plate PLT1 and the digitizer DGT. The first support plate PLT1 and the digitizer DGT may be bonded to each other by the seventh adhesive layer AL7. The seventh adhesive layer AL7 may not be disposed on the folding area FA. That is, the seventh adhesive layer AL7 may be opened in the folding area FA.

The above-described cover layer COV may be disposed in the opening of the seventh adhesive layer AL7. Since the seventh adhesive layer AL7 is not disposed under the folding area FA, the folding operation of the support part SUP may be more easily performed.

The eighth adhesive layer AL8 may be disposed between the shielding layer SHL and the second support plate PLT2. The shielding layer SHL and the second support plate PLT2 may be bonded to each other by the eighth adhesive layer AL8. The eighth adhesive layer AL8 may be divided to be separated from each other from the folding area FA. The portions of the eighth adhesive layer AL8, which are separated from each other, may be disposed between the portions of the shielding layer SHL, which are separated from each other, and the second_1 and second_2 support plates PLT2_1 and PLT2_2, respectively. The eighth adhesive layer AL8 may be disposed between the second insulating tape ITP2 and the third insulating tape ITP3.

A width of the first support plate PLT1 may be substantially the same as the width of the electronic panel EP which corresponds to the first area AA1. A width of each of the digitizer DGT and the seventh adhesive layer AL7 may be less than that of each of the first support plate PLT1. The edges of the digitizer DGT and the seventh adhesive layer AL7 may be disposed inside the edge of the first support plate PLT1.

A width of each of the shielding layer SHL, the eighth adhesive layer AL8, and the second support plate PLT2 may be less than that of the digitizer DGT. Edges of the shielding layer SHL, the eighth adhesive layer AL8, and the second support plate PLT2 may be disposed inside the edge of the digitizer DGT.

The thickness of the first support plate PLT1 may be greater than that of the digitizer DGT, and the thickness of the digitizer DGT may be greater than that of the second support plate PLT2. The thickness of the second support plate PLT2 may be greater than that of the heat dissipation layer RHL, and the thickness of the heat dissipation layer RHL may be greater than that of each of the seventh and eighth adhesive layers AL7 and AL8.

A thickness of each of the seventh and eighth adhesive layers AL7 and AL8 may be greater than that of the shielding layer SHL, and a thickness of the shielding layer SHL may be greater than that of the cover layer COV. The thickness of the cover layer COV may be the same as that of the sixth adhesive layer AL6.

A thickness of each of the first insulating tapes ITP1 may be less than that of the first support plate PLT1 and be greater than that of the digitizer DGT. A thickness of the third insulating tape ITP3 may be greater than that of the first support plate PLT1. A thickness of the fourth insulating tape ITP4 may be less than that of each of the first insulating tapes ITP1. The thickness of the second insulating tape ITP2 may be less than that of the fourth insulating tape ITP4.

Each of the seventh and eighth adhesive layers AL7 and AL8 may include a pressure sensitive adhesive (PSA) or an optically clear adhesive (OCA), but the type of adhesive is not limited thereto.

A first hole H1 may be defined in a portion of the display module DM overlapping the first transmission area HAL. The first hole H1 may be defined from the heat dissipation layer RHL up to the panel protective layer PPL. The panel protective layer PPL may be exposed to outside the display device DD at the first hole H1. For example, the first hole H1 may be integrally defined in the barrier layer BRL, the first support plate PLT1, the digitizer DGT, the shielding layer SHL, the second support plate PLT2, the heat dissipation layer RHL, and fifth to eighth adhesive layers AL5 to AL8.

Although not shown, a second hole may be formed (or provided) corresponding to the second transmission area HA2, and the second hole may be defined from the heat dissipation layer RHL up to the panel protective layer PPL in the same manner as the first hole H1. The above-described camera CA may be disposed in the first hole H1, and the above-described sensor SN may be disposed in the second hole.

The display device DD may include a protective layer BPL. The protective layer BPL may be disposed on the bending area BA of the electronic panel EP which extends further than the first area AA1. The protective layer BPL may extend from the bending area BA and to the second area AA2 and be disposed on a portion of the second area AA2 of the electronic panel EP which is adjacent to the bending area BA. The protective layer BPL may be spaced apart from the data driver DDV. The protective layer BPL may include an acrylic resin or a urethane resin.

One surface (e.g., a first side surface) of the protective layer BPL, which is adjacent to (or closest to) the first area AA1, may face one surface (e.g., a side surface OS1) of the impact absorption layer ISL which is adjacent to the bending area BA, and one surface (e.g., a side surface OS2) of the third adhesive layer AL3, which is adjacent to the bending area BA. The protective layer BPL may be spaced apart from the one surface of the impact absorption layer ISL and may be in contact with the one surface of the third adhesive layer AL3.

A groove GV may be defined recessed from a top surface of the protective layer BPL at a portion of the protective layer BPL which is adjacent to the first area AA1. The top surface of the protective layer BPL may be defined as one surface of the protective layer BPL, which does not face the display panel DP in the electronic panel EP, such as a surface which is furthest from the electronic panel EP. Specifically, the top surface of the protective layer BPL may be defined as one surface of the protective layer, which is opposite to the surface of the protective layer facing the display panel DP.

The groove GV may not be defined recessed from a portion of the top surface of the protective layer BPL which is adjacent to the second area AA2. That is, the groove GV may be adjacent to the first area AA1 and may not be adjacent to the second area AA2. An upper thickness portion of the protective layer BPL may be spaced apart from the impact absorption layer ISL by the groove GV. The groove GV may extend to have a major dimension in the first direction DR1.

The protective layer BPL may serve to protect the bending area BA. The protective layer BPL may cover lines (e.g., signal lines, conductive lines, etc.) disposed on the bending area BA to protect the lines disposed on the bending area BA. The protective layer BPL may complement rigidity of the bending area BA, and when the bending area BA is bent, cracking of the bending area BA may be prevented. The protective layer BPL may protect the bending area BA against an external impact.

Referring to FIGS. 12 and 13, the panel protective layer PPL and the fourth adhesive layer AL4 may not be disposed under the bending area BA. Portions of the panel protective layer PPL and the fourth adhesive layer AL4 may be disposed under both the first area AA1 and the second area AA2 of the electronic panel EP. The data driver DDV may be disposed on the second area AA2 of the electronic panel EP.

The printed circuit board PCB may be connected to the electronic panel EP at the second area AA2 of the electronic panel EP. The printed circuit board PCB may be connected to one side of the second area AA2 among sides opposing each other along the second direction DR2. Referring to FIG. 13, the bending area BA which is bent disposes the second area AA2 under the first area AA1. Thus, the data driver DDV and the printed circuit board PCB may be disposed under the first area AA1.

Figure 14:
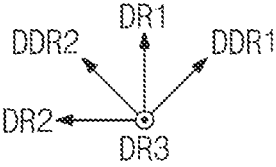
FIG. 14 is an enlarged plan view illustrating a first transmission area of the display panel of FIG. 12.

FIG. 14 is an enlarged plan view illustrating the first transmission area HA' of the display panel DP of FIG. 12.

For example, although a planar configuration of the first transmission area HA' is illustrated, a planar configuration of the second transmission area HA2 may also be substantially the same as that of the first transmission area HA'.

Referring to FIG. 14, the display area DA may include a first display area DA1, a second display area DA2, and a boundary area BNA between the first display area DA1 and the second display area DA2.

The second display area DA2 may overlap the first transmission area HAL Substantially, the second display area DA2 may be defined by the first transmission area HA' and may be defined as the same area as the first transmission area HAL The first display area DA1 may surround the second display area DA2. The second display area DA2 may have light transmittance greater than that of the first display area DA1.

The pixels PX may include a plurality of first pixels PX1, a plurality of second pixels PX2, and a plurality of dummy pixels DPX. The first pixels PX1 may be disposed on (or in) the first display area DA1. The second pixels PX2 may be disposed on the second display area DA2. The dummy pixels DPX may be disposed on the boundary area BNA.

For example, the boundary area BNA adjacent to the first display area DA1 may have a schematic octagonal shape. However, the planar shape of the boundary area BNA is not limited thereto.

The first pixels PX1 may be arranged in the first direction DR1 and the second direction DR2 within the first display area DA1. The second pixels PX2 may be arranged in the first direction DR1 and the second direction DR2 within the second display area DA2. However, the arranged shape of the first and second pixels PX1 and PX2 is not limited thereto.

The dummy pixels DPX may be disposed to surround the second display area DA2 along the boundary area BNA. Each of the second pixels PX2 and the dummy pixels DPX may include a plurality of sub-pixels, which display red, green, and blue colors. The first pixels PX1 and the sub-pixels of the second pixels PX2 and the dummy pixels DPX, may have substantially similar structures to each other.

The first display area DA1 may display an image IM by the first pixels PX1 which generate and emit light for displaying the image IM. The second display area DA2 may display an image IM by the second pixels PX2 which generate and emit light for displaying the image IM. The boundary area BNA may display an image IM by the dummy pixels DPX which generate and emit light for displaying the image IM. Accordingly, a predetermined image may be displayed the display area DA by the light generated by the first pixels PX1, the second pixels PX2, and the dummy pixels DPX.

The display panel DP may include a plurality of transmission areas TA disposed on the second display area DA2. The transmission areas TA may not be disposed on the first display area DA1. The transmission areas TA may be disposed between the second pixels PX2. The transmission areas TA may be disposed between the dummy pixels DPX and the second pixels PX2 which are adjacent to the dummy pixels DPX.

For example, the transmission areas TA may have a cross shape in a plan view, but the planar shape of the transmission areas TA is not limited thereto. The transmission areas TA may be disposed around each of the second pixels PX2. The transmission areas TA may be disposed in a first diagonal direction DDR1 and a second diagonal direction DDR2 with respect to each of the second pixels PX2.

The first diagonal direction DDR1 may be defined as a direction crossing the first and second directions DR1 and DR2 on a plane defined by the first and second directions DR1 and DR2. The second diagonal direction DDR2 may be defined as a direction crossing the first diagonal direction DDR1 on the plane defined by the first and second directions DR1 and DR2. For example, the first and second directions DR1 and DR2 may cross each other to be perpendicular to each other, and the first and second diagonal directions DDR1 and DDR2 may cross each other to be perpendicular to each other.

The pixels PX may not be disposed on the transmission areas TA. Thus, the transmission areas TA may have light transmittance greater than that of each of the first and second pixels PX1 and PX2 and the dummy pixels DPX.

Light (the above-described optical signal) passing through the transmission areas TA may be provided to the camera CA disposed under the second display area DA2. That is, the light transmittance of the first transmission area HA' may be improved by the transmission areas TA defined within the display panel DP, and the light may be provided to the camera CA through the first transmission area HAL Thus, the second display area DA2 may display an image IM, and the light passing through the second display area DA2 may be provided to the camera CA to photograph an external image.

Although not shown, a portion of the display panel DP overlapping the second transmission area HA2 may also have substantially the same configuration as the second display area DA2 illustrated in FIG. 14.

Figure 15:
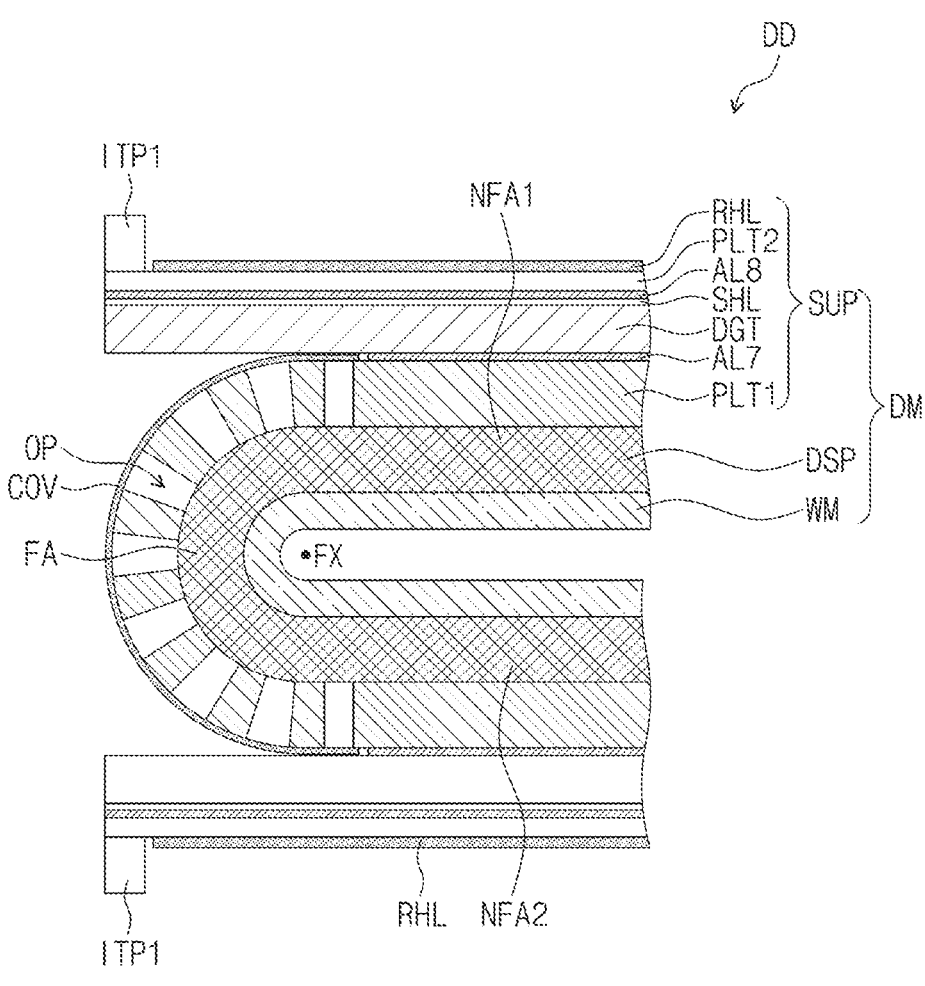
FIG. 15 is a view illustrating an example of a folded state of the display device of FIG. 12.

FIG. 15 is a view illustrating an example of the folded state of the display device DD of FIG. 12.

For convenience of description, in FIG. 15, the bending area BA and the second area AA2 of the electronic panel EP illustrated in FIG. 12 are omitted. In addition, the window module WM and the display part DSP are each illustrated as a single layer.

Referring to FIG. 15, the display device DD may be in-folded with respect to the folding axis FX. The folding area FA may be bent so that the first non-folding area NFA1 and the second non-folding area NFA2 face each other. The display device DD may be changed from the flat first state of FIG. 12 to the folded second state of FIG. 15 or changed from the folded second state to the flat (or unfolded) first state. The folding operation may be performed repeatedly.

A plurality of openings OP overlapping the folding area FA may be defined in the first support plate PLT1. Therefore, during the folding operation, a portion of the first support plate PLT1 overlapping the folding area FA may be easily bent by the openings OP.

Referring to FIG. 12, the cover layer COV may be in contact with the first support plate PLT1 without being in contact with the digitizer DGT. That is, the cover layer COV may be attached to the first support plate PLT1 while being unattached or removably attached to the digitizer DGT. When the display device DD is folded, portions of the digitizer DGT, which are separated from each other, may be moved away from each other to be spaced apart from each other along a thickness direction of the display device DD which is folded.

When the cover layer COV is attached to the first support plate PLT1 and the digitizer DGT, movement of the portions of the digitizer DGT in a direction away from each other may be restricted due to adhesive force between the digitizer DGT and the cover layer COV when the display device DD is folded. Thus, the folding operation of the digitizer DGT may be difficult.

In an embodiment of the invention, the cover layer COV may not be attached to the digitizer DGT (or may be removably attached), but be attached to the first support plate PLT1 to easily fold the display device DD.

Figure 16:
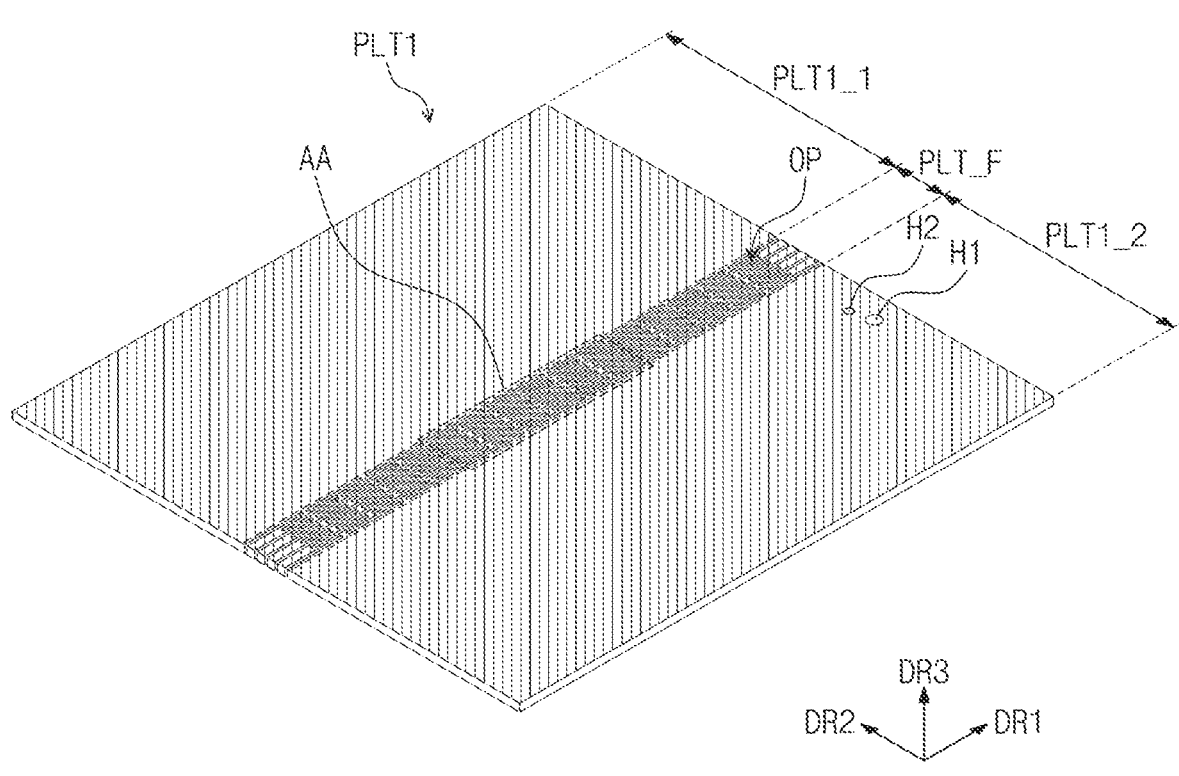
FIG. 16 is a perspective view illustrating a first support plate of FIG. 12.

FIG. 16 is a perspective view illustrating the first support plate PLT1 of FIG. 12.

Referring to FIG. 16, the first support plate PLT1 may include a first_1 plate PLT1_1 (e.g., a first non-folding portion), a first_2 plate PLT1_2 (e.g., a second non-folding portion), and a folding plate PLT_F (e.g., a folding portion). The folding plate PLT_F may be disposed between the first_1 plate PLT1_1 and the first_2 plate PLT1_2. The first_1 plate PLT1_1 and the first_2 plate PLT1_2 may overlap the first non-folding area NFA1 and the second non-folding area NFA2, which are illustrated in FIG. 12, respectively. The folding plate PLT_F may overlap the folding area FA illustrated in FIG. 12.

A lattice pattern may be defined on (or in) the folding plate PLT_F. For example, a plurality of openings OP may be defined in the folding plate PLT_F. The openings OP may be arranged in a predetermined pattern. The openings OP may be arranged in a grid shape to form the grid pattern of the folding plate PLT_F.

Since the openings OP are defined in the folding plate PLT_F, an area corresponding to solid portion of the folding plate PLT_F may be reduced to reduce a rigidity of the folding plate PLT_F. Thus, when the openings OP are defined, flexibility of the folding plate PLT_F may be higher when compared to a case in which the openings OP are not defined in the folding plate PLT_F and the first support plate PLT1 includes only a solid portion of material. As a result, the folding plate PLT_F may be more easily folded.

The first hole H1 and the second hole H2, which are described above, may be defined in the first_2 plate PLT1_2. The first hole H1 and the second hole H2 may be adjacent to an edge (e.g., an outer edge) of the first_2 plate PLT1_2.

Figure 17:
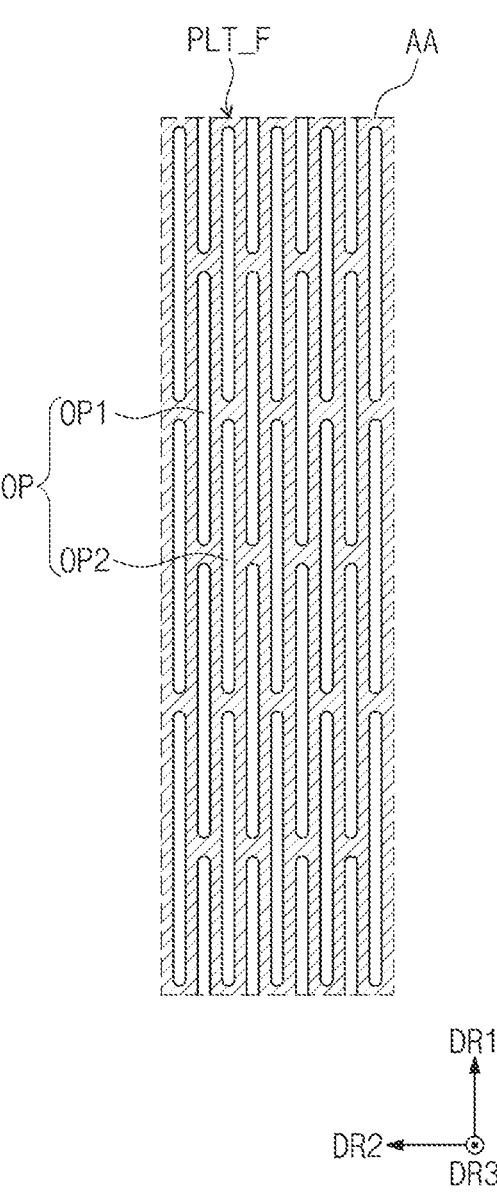
FIG. 17 is an enlarged plan view illustrating an area AA of FIG. 16.

FIG. 17 is an enlarged plan view illustrating an area AA of FIG. 16.

Referring to FIG. 17, the openings OP may arranged in the first direction DR1 and in the second direction DR2. The openings OP may extend to be longer in the first direction DR1 than in the second direction DR2. That is, the openings OP may have a major dimension in the first direction DR1 and a minor dimension in the second direction DR2. That is, the openings OP may extend in a direction parallel to the above-described folding axis FX.

The openings OP may include a plurality of first openings OP1 arranged spaced apart from each other in the first direction DR1, and a plurality of second openings OP2 arranged spaced apart from each other in the first direction so as to be adjacent to the first openings OP1 in the second direction DR2. The first openings OP1 and the second openings OP2 may be dislocated or staggered with respect to each other (e.g., along the second direction DR2).

Figure 18:
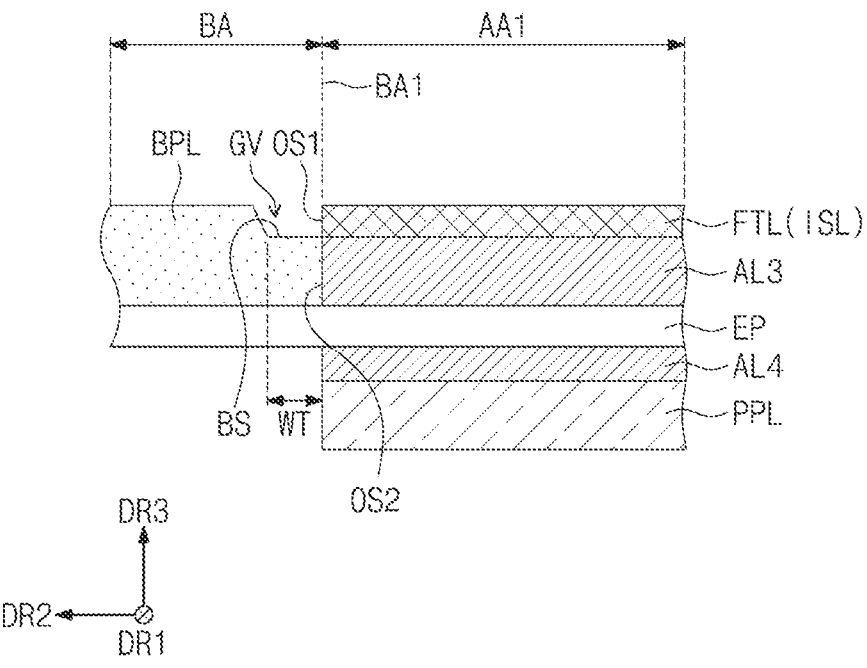
FIG. 18 is an enlarged view illustrating a groove of FIG. 12 and a portion of the display module, which is adjacent to the groove.
Figure 19:
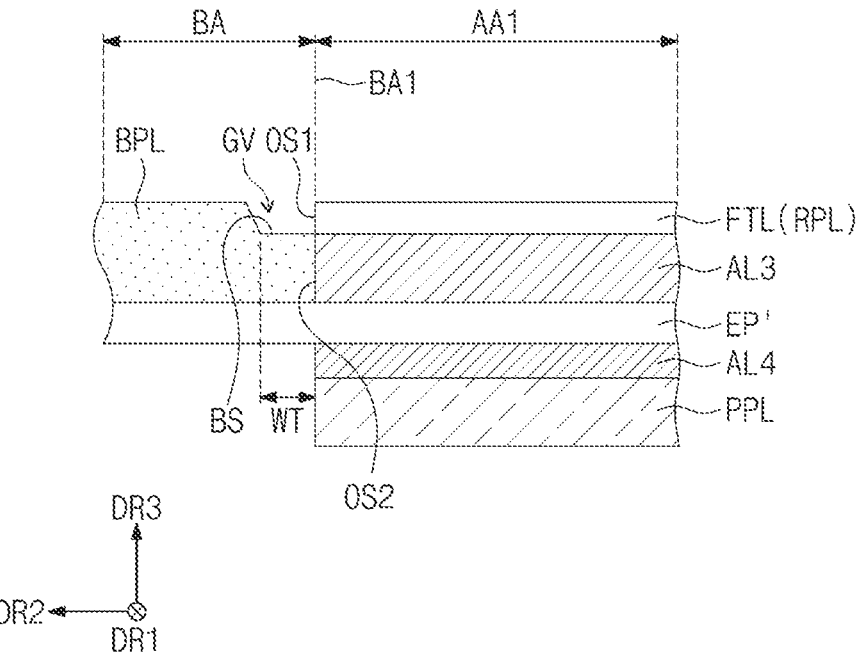
FIG. 19 is an enlarged view illustrating a groove defined in an electronic panel and a portion of a display module, which is adjacent to the groove, according to an embodiment of the invention.

FIG. 18 is an enlarged view illustrating the groove GV of FIG. 12 and a portion of the display module DM, which is most adjacent to the groove GV. FIG. 19 is an enlarged view illustrating a groove GV defined in an electronic panel EP and a portion of a display module DM, which is most adjacent to the groove GV, according to an embodiment of the invention.

The electronic panel EP illustrated in FIG. 18 may be the electronic panel EP illustrated in FIG. 8. An electronic panel EP' illustrated in FIG. 19 may be the electronic panel EP' illustrated in FIG. 9.

Referring to FIGS. 8 and 18, when the electronic panel EP includes the anti-reflection layer RPL, an impact absorption layer ISL may be disposed on the electronic panel EP. The third adhesive layer AL3 may be disposed between the impact absorption layer ISL and the first area AA1 of the electronic panel EP.

Referring to FIGS. 9 and 19, when the electronic panel EP' does not include the anti-reflection layer RPL, the anti-reflection layer RPL may be disposed on the electronic panel EP'. The anti-reflection layer RPL may be disposed on the electronic panel EP' instead of the impact absorption layer ISL. That is, in FIG. 19, the impact absorption layer ISL may not be used.

The third adhesive layer AL3 may be disposed between the first area AA1 of the electronic panel EP' and the anti-reflection layer RPL. The impact absorption layer ISL and the anti-reflection layer RPL may be bonded to each other by the third adhesive layer AL3. That is, the anti-reflection layer RPL may be manufactured as a separate panel and be attached to a top surface of the electronic panel EP'.

In this case, the anti-reflection layer RPL may include a polarizing film to reduce reflectance of external light. The polarizing film may be separately manufactured and attached to the input sensing part ISP of the electronic panel EP' by the adhesive layer. The polarizing film may include a retarder and/or a polarizer.

Referring to FIGS. 18 and 19, the impact absorption layer ISL and the anti-reflection layer RPL may be defined as a functional layer FTL. That is, the functional layer FTL may include the impact absorption layer ISL or the anti-reflection layer RPL corresponding to the structure of the underlying electronic panel. However, this is merely an example, and the functional layer FTL may further include components that provide various functions in addition to the impact absorption layer ISL and the anti-reflection layer RPL.

The functional layer FTL may be disposed on the first area AA1, and the protective layer BPL may be disposed on the bending area BA to be excluded from the first area AA1. The groove GV may be defined (or extend) from a first boundary BA1 (e.g., a boundary) between the first area AA1 and the bending area BA, up to a portion of the bending area BA which is adjacent to the first boundary BA1.

In the portion of the protective layer BP, in which the groove GV is not defined, the top surface of the protective layer BPL may be disposed higher than the third adhesive layer AL3, that is, further from the third adhesive layer AL3 than the groove top surface at the groove GV. The top surface of the protective layer BPL may be disposed at the same height as the top surface of the functional layer FTL, but the embodiment of the invention is not limited thereto. For example, under the condition that the protective layer BPL is disposed higher than the third adhesive layer AL3, the top surface of the protective layer BPL may be disposed at a different height from the top surface of the functional layer FTL. The top surface of the functional layer FTL may be defined as one surface of the functional layer FTL, which does not face the electronic panel EP (or the display panel DP) and/or is furthest from the electronic panel EP (or the display panel DP).

A bottom surface BS of the groove GV may define the groove top surface and be disposed at the same height as the top surface of the third adhesive layer AL3. The top surface of the third adhesive layer AL3 may be defined as one surface of the third adhesive layer AL3 facing the functional layer FTL. The bottom surface BS of the groove GV may indicate the lowest surface of the protective layer BPL at the portion of the protective layer BPL in which the groove GV is defined. According to this structure, the groove GV may expose a side surface OS1 of the functional layer FTL, which is adjacent to the bending area BA, to outside the protective layer BPL.

The protective layer BPL may be in contact with a side surface OS2 of the third adhesive layer AL3, which is adjacent to the bending area BA, under the groove GV. The bending area BA of the electronic panel EP (or the display panel DP) may not be exposed to the outside by the protective layer BPL under (or at) the groove GV.

A groove width WT of the groove GV in the second direction DR2 may be about 100 micrometers (μm) to about 300 micrometers (μm). The second direction DR2 may be defined as a direction in which the first area AA1, the bending area BA, and the second area AA2 are arranged. The groove width WT of the groove GV may be defined as a width of the bottom surface BS of the groove GV.

Hereinafter, an embodiment of the invention will be described with reference to the configuration in which the impact absorption layer ISL is disposed on the electronic panel EP illustrated in FIG. 18. However, the embodiment of the invention is not limited thereto, and configurations to be described below may also be applied to the configuration in which the anti-reflection layer RPL is disposed on the electronic panel EP′ illustrated in FIG. 19.

Figure 20:
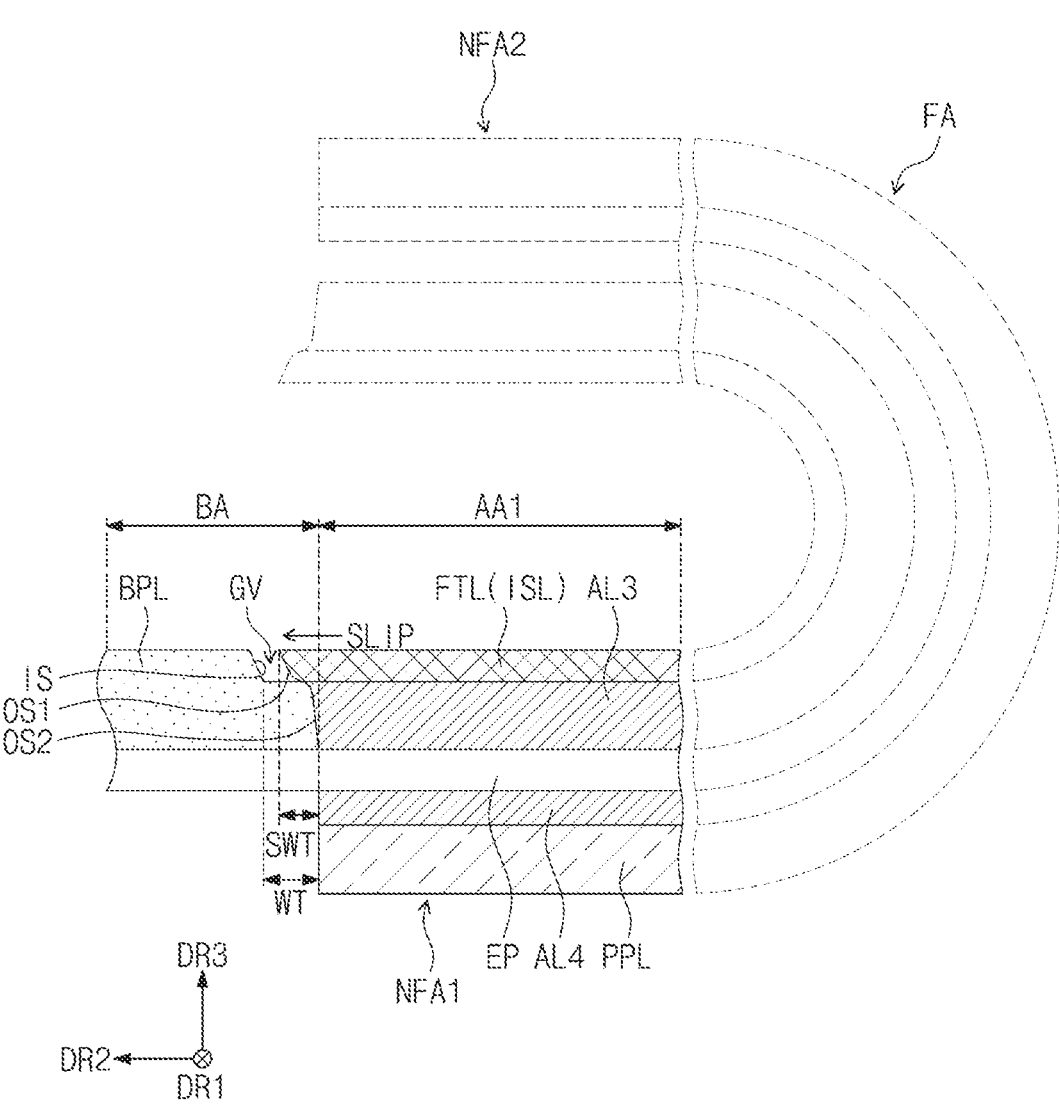
FIG. 20 is a view illustrating a folded state of an electronic panel and an impact absorption layer of FIG. 18.

FIG. 20 is a view illustrating a folded state of the electronic panel EP and the impact absorption layer ISL of FIG. 18.

Referring to FIG. 20, when the display device DD is in-folded, the electronic panel EP and the functional layer FTL may be folded together with each other. A portion indicated by a dotted line in FIG. 20 may be the first area AA1. For convenience of description, a reference symbol of the first area AA1 will be omitted at the portion indicated by the dotted lines.

When the folding area FA is folded, and the first area AA1 is folded, the functional layer FTL disposed inside the electronic panel EP may slip or move in a direction along the electronic panel EP to be slipped. For example, the side surface OS1 (or end surface) of the functional layer FTL may be slipped from the first area AA1 toward the bending area BA by the third adhesive layer AL3 having flexibility. That is, folding of the electronic panel EP disposes the functional layer FTL extended from the first area AA1 to the bending area BA. The third adhesive layer AL3 may also be slipped from the first area AA1 toward the bending area BA.

The groove width WT of the groove GV in the second direction DR2 may be greater than a slip width SWT of the functional layer FTL as a distance from the first area AA1 at which the functional layer FTL extends into the bending area BA from the first area AA1. The slip width SWT of the functional layer FTL may be defined as a movement amount of functional layer FTL, which is slipped when the folding area FA is deformed from the unfolded state to the folded state.

According to this structure, when the folding area FA is folded, the side surface OS1 of the functional layer FTL may not be in contact with an inner surface IS of the protective layer BPL which defines the recess (e.g., the groove GV) together with the bottom surface BS. The inner surface IS of the protective layer BPL may be defined as one surface of the protective layer BPL facing the side surface OS1 of the functional layer FTL at the portion where the groove GV is defined.

Figure 21:
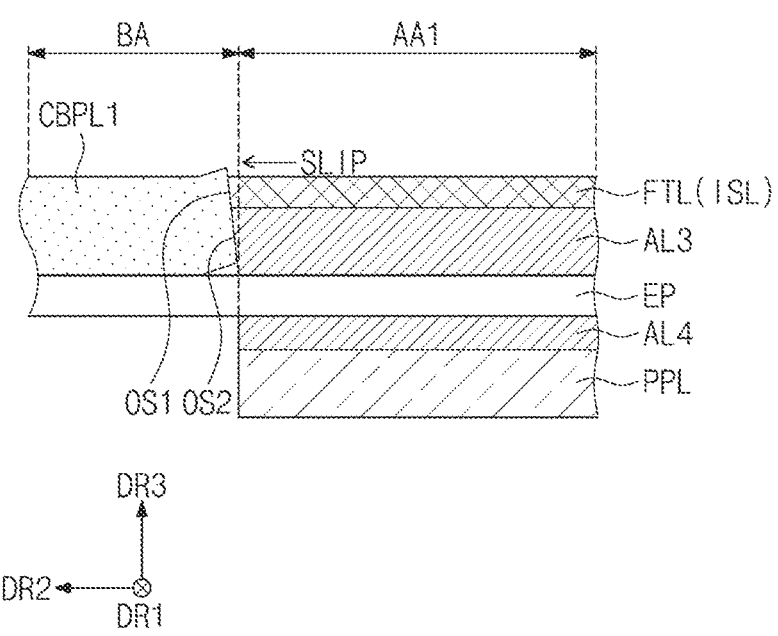
FIG. 21 is a view illustrating a configuration of a protective layer according to a first comparative embodiment.
Figure 22:
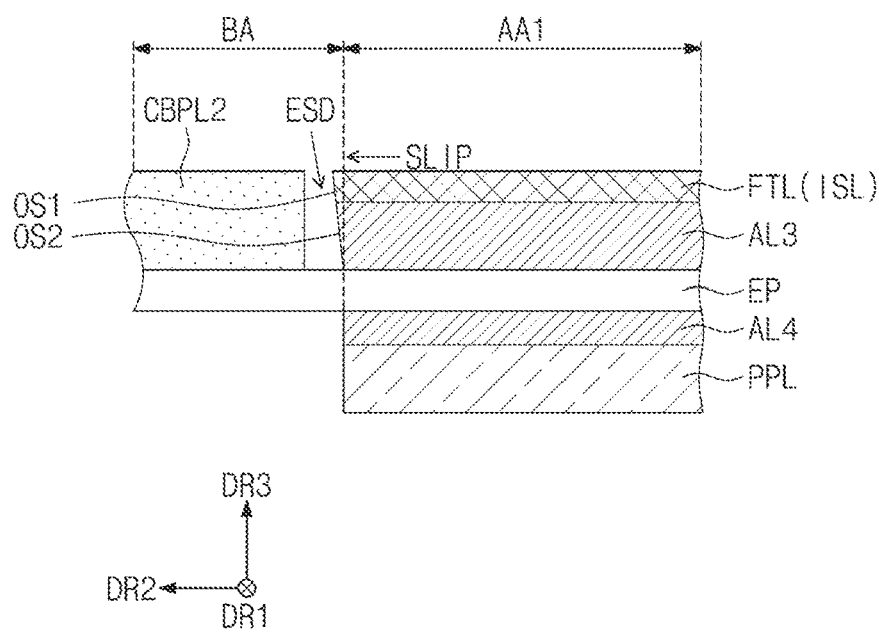
FIG. 22 is a view illustrating a configuration of a protective layer according to a second comparative embodiment.

FIG. 21 is a view illustrating a configuration of a comparison protective layer according to a first comparative embodiment. FIG. 22 is a view illustrating a configuration of a comparison protective layer according to a second comparative embodiment.

Referring to FIG. 21, a first comparison protective layer CBPL1 may be in contact with the side surface OS1 of the functional layer FTL and the side surface OS2 of the third adhesive layer AL3. Although the folding area FA is not shown, actually, FIG. 21 illustrates a state in which the functional layer FTL is folded.

As described in FIG. 20, during the folding operation, the functional layer FTL and the third adhesive layer AL3 may be slipped toward the bending area BA. The third adhesive layer AL3 may have flexibility, and the functional layer FTL may have a harder property than the third adhesive layer AL3. That is, the functional layer FTL has less flexibility as a less flexible layer, than the third adhesive layer AL3 as a flexible layer. The slipping third adhesive layer AL3 and functional layer FTL may push the first comparison protective layer CBPL1.

Even if the third adhesive layer AL3 pushes the first comparison protective layer CBPL1, the third adhesive layer AL3 has flexibility, and thus, the third adhesive layer AL3 may not be significantly affected on the first comparison protective layer CBPL1. However, when the functional layer FTL having the harder property pushes the first comparison protective layer CBPL1, the first comparison protective layer CBPL1 may be affected by the pushing force of the functional layer FTL.

The first comparison protective layer CBPL1 may be delaminated and separated from the electronic panel EP by the pushing force of the functional layer FTL. When the first comparison protective layer CBPL1 is delaminated, a top surface of the bending area BA of the electronic panel EP (or the display panel DP) may be damaged by the delamination force of the first comparison protective layer CBPL1. For example, the lines disposed on the bending area BA of the electronic panel EP (or the display panel DP) may be damaged by the delamination force of the first comparison protective layer CBPL1.

Referring back to FIG. 20, according to an embodiment of the invention, the groove GV may be defined in the top surface of the protective layer BPL adjacent to the functional layer FTL, and thus, an upper portion of the protective layer BPL may be spaced apart from the functional layer FTL. Thus, when the folding area FA is folded, the slipping functional layer FTL may not be in contact with the protective layer BPL in a plane of the inner surface IS. As a result, since the functional layer FTL does not push the protective layer BPL, the delamination of the protective layer BPL may be prevented, and the damage of the bending area BA of the electronic panel EP (or the display panel DP) attached to the protective layer BPL may be prevented.

Referring to FIG. 22, a second comparison protective layer CBPL2 may be spaced apart from the side surface OS1 of the functional layer FTL and the side surface OS2 of the third adhesive layer AL3. Although the folding area FA is not shown, actually, FIG. 22 illustrates a state in which the functional layer FTL is folded.

As described for FIG. 20, during the folding operation, the functional layer FTL and the third adhesive layer AL3 may be slipped toward the bending area BA. Even though the folding area FA is folded, the functional layer FTL and the third adhesive layer AL3 may not be in contact with the second comparison protective layer CBPL2.

However, external static electricity ESD may be applied to the bending area BA of the electronic panel EP (or the display panel DP) through spaces between the second comparison protective layer CBPL2 and the functional layer FTL and between the second comparison protective layer CBPL2 and the third adhesive layer AL3. The lines disposed on the bending area BA of the electronic panel EP (or the display panel DP) may be damaged by the static electricity ESD.

Referring back to FIG. 20, according to an embodiment of the invention, a portion of the protective layer BPL under the groove GV may be disposed to be in contact with the side surface OS2 of the third adhesive layer AL3 under the functional layer FTL. Thus, the portion of the bending area BA adjacent to the third adhesive layer AL3 may not be exposed to the outside by the protective layer BPL. As a result, the external static electricity ESD applied to the bending area BA of the electronic panel EP (or the display panel DP) may be blocked by the protective layer BPL, and thus, the bending area BA of the electronic panel EP (or the display panel DP) may be protected.

FIGS. 23 to 27 are view illustrating shapes of grooves according to various embodiments of the invention.

For example, FIGS. 24 to 27 illustrate a cross-section corresponding to FIG. 18. Hereinafter, configurations of grooves GV-1 to GV-5 illustrated in FIGS. 23 to 27 will be described, focusing on configurations different from the groove GV illustrated in FIG. 18.

Figure 23:
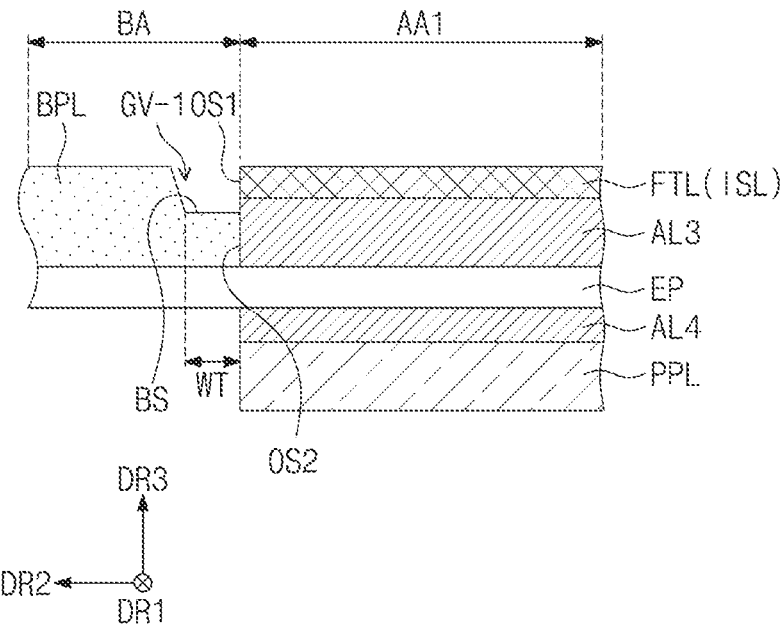
FIGS. 23 to 27 are view illustrating shapes of grooves according to various embodiments of the invention.

Referring to FIG. 23, unlike the groove GV illustrated in FIG. 18, a bottom surface BS of the groove GV-1 may be disposed lower than the top surface of the third adhesive layer AL3. That is, the top surface of the protective layer BPL at the groove GV-1 is in a different plane than the top surface of the third adhesive layer AL3, as compared to the top surface of the protective layer BPL at the groove GV in FIG. 18 being coplanar with the top surface of the third adhesive layer AL3. The groove GV-1 may expose the side surface OS1 of the functional layer FTL adjacent to the bending area BA. A depth of the groove GV-1 may be greater than that of the groove GV. Since the protective layer BPL is in contact with the side surface OS2 of the third adhesive layer AL3 adjacent to the bending area BA under the groove GV-1, the bending area BA may not be exposed to the outside.

Figure 24:
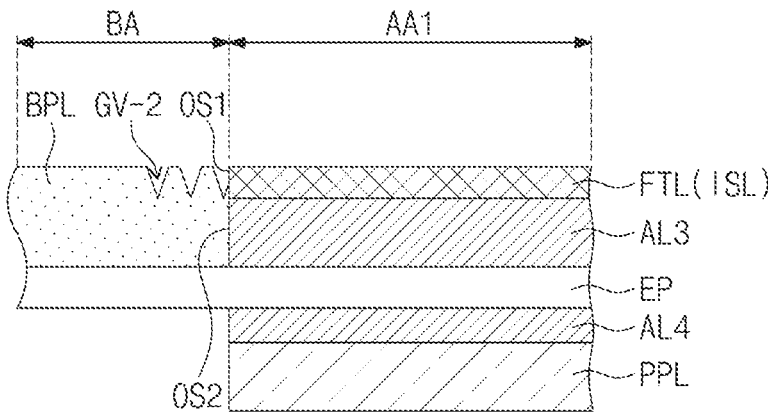
Figure 24:
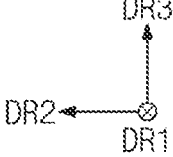

Referring to FIG. 24, a groove GV-2 provided in plural including a plurality of grooves GV-2 may be defined recessed from a portion of the top surface of the protective layer BPL adjacent to the functional layer FTL. The groove GV-2 adjacent to the functional layer FTL among the grooves GV-2 may expose the side surface OS1 of the functional layer FTL to outside the protective layer BPL, while the protective layer BPL is in contact with the side surface OS2 of the third adhesive layer AL3 adjacent to the bending area BA under the grooves GV-2. In FIG. 24, the protective layer BPL includes solid portions alternated with the grooves GV-2, where the solid portions are coplanar with the functional layer FTL. The groove GV-2 closest to the first area AA1 is between the closest solid portion of the protective layer BPL and the first area AA1, such that the groove GV-2 and the solid portion are in order from the side surface OS1 of the functional layer FTL.

Figure 25:
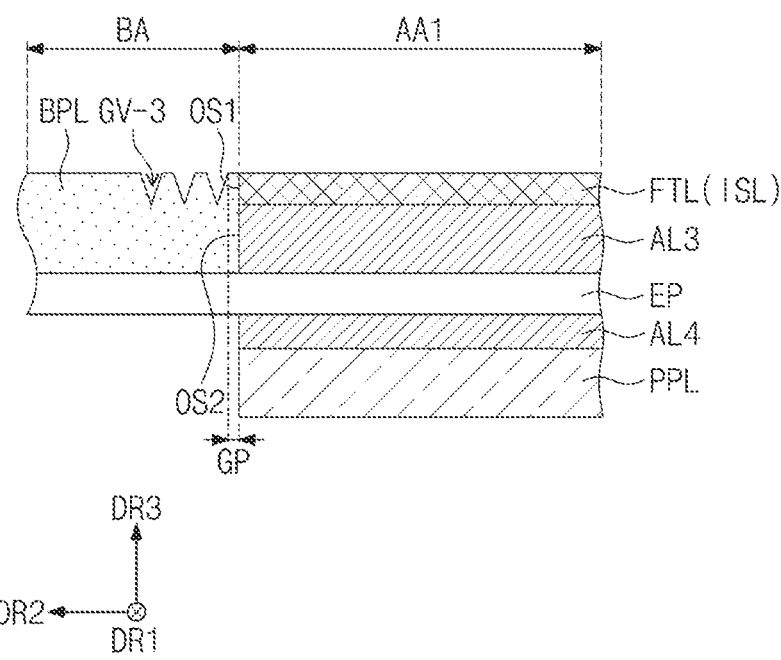
Figure 26:
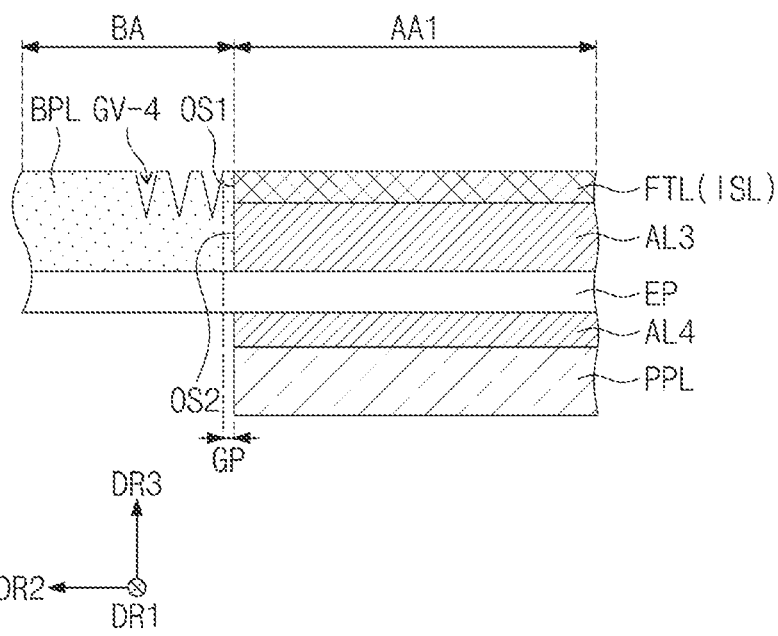

Referring to FIGS. 25 and 26, a plurality of grooves GV-3 and GV-4 may be defined recessed from a portion of the top surface of the protective layer BPL adjacent to the functional layer FTL. The grooves GV-3 and GV-4 may be spaced apart from the functional layer FTL. The grooves GV-3 and GV-4 respectively closest to the first area AA1 are spaced apart from the first area AA1 by the closest solid portion of the protective layer BPL. That is, the groove GV-3 (or the groove GV-4) and the solid portion are in order from the side surface OS1 of the functional layer FTL. The grooves GV-3 and GV-4 may not expose the side surface OS1 of the functional layer FTL to outside the protective layer BPL. However, during the folding operation, the pushing force of the slipping functional layer FTL may be relieved according to buffering actions of the grooves GV-3 and GV-4 respectively defined between (or by) protruding portions (e.g., protrusions) of the protective layer BPL. The protruding portions may extend from a base of the protective layer BPL which is common to the respective grooves and to a thickness portion of the protective layer BPL which is further from the first area AA1 than a groove furthest from the first area AA1.

For example, a gap GP between the grooves GV-3 and GV-4 which are closest to the functional layer FTL (e.g., a closest groove), among the grooves GV-3 and GV-4 and the functional layer FTL may be about 10 micrometers (μm) to about 100 micrometers (μm). The gap GP may be a minimum width of a solid portion of the protective layer BPL which is between the closest groove and the side surface OS1 of the functional layer FTL.

Referring to FIG. 25, a bottom surface of each of the grooves GV-3 may be disposed at the same height as the top surface of the third adhesive layer AL3 (e.g., coplanar with each other).

Referring to FIG. 26, a bottom surface of each of the grooves GV-4 may be disposed lower than the top surface of the third adhesive layer AL3 (e.g., in a different plane from the plane of the top surface of the third adhesive layer AL3).

Figure 27:
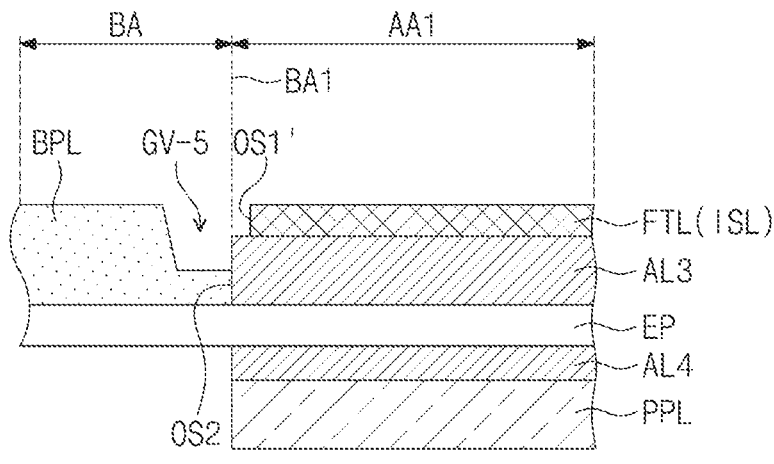
Figure 27:
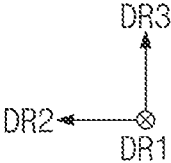

Referring to FIG. 27, a groove GV-5 may be defined recessed from a portion of the top surface of the protective layer BPL adjacent to the functional layer FTL. A side surface OS1' of the functional layer FTL adjacent to the bending area BA may be spaced apart from the first boundary BA1 between the bending area BA and the first area AA1 and may be disposed in the first area AA1. A depth of the groove GV-5 may be greater than that of the groove GV-1.

FIGS. 28 to 31 are views for explaining a method for manufacturing (or providing) a display device DD according to an embodiment of the invention.

Figure 28:
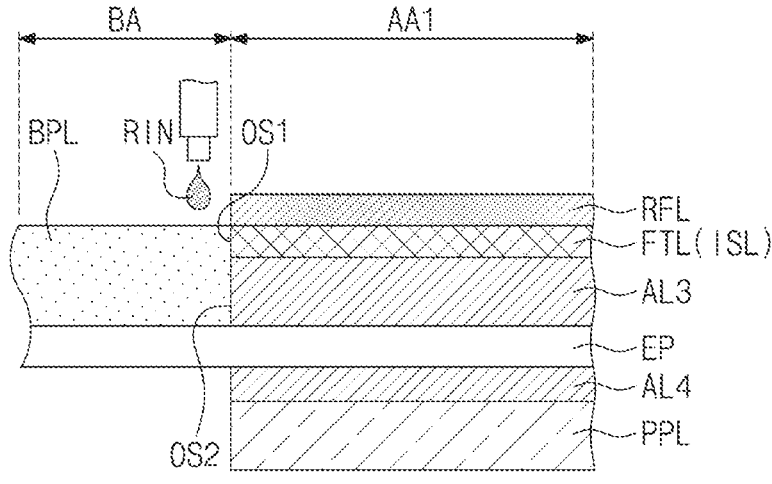
FIGS. 28 to 31 are views for explaining a method for manufacturing a display device according to an embodiment of the invention.
Figure 28:

Referring to FIG. 28, an electronic panel EP may be prepared, and a functional layer FTL and a release film RFL which is disposed on the functional layer FTL, may be provided on a first area AA1 of the electronic panel EP. The electronic panel EP may have a first boundary BA1 between the first area AA1 and the bending area BA.

In a state in which the release films are attached to top and bottom surfaces of the functional layer FTL, the functional layer FTL may be transferred. The release films may protect the functional layer FTL. After the release film RFL attached to the bottom surface of the functional layer FTL is removed, the bottom surface of the functional layer FTL may be attached to a third adhesive layer AL3. The release film RFL attached to the top surface of the functional layer FTL may not be removed (e.g., may remain) when the groove GV is formed.

A resin RIN for forming a protective layer BPL on a bending area BA may be provided to the bending area BA. The resin RIN may be provided to be in contact with a side surface OS1 of the functional layer FTL (e.g., a less flexible layer) and side surface OS2 of the third adhesive layer AL3 (e.g., a more flexible layer). The resin RIN may be cured to form a protective layer BPL. Thus, the protective layer BPL may be provided on the bending area BA. The protective layer BPL in FIG. 28 may represent a preliminary protective layer including a full thickness portion closest to the first area AA1.

Figure 29:
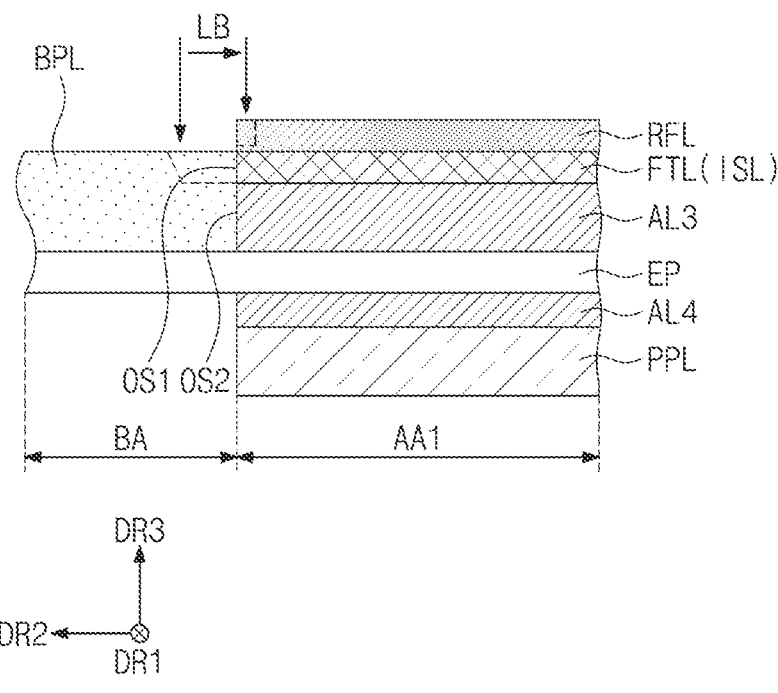

Referring to FIG. 29, laser beam LB may be irradiated onto a portion of the top surface of the protective layer BPL in the preliminary form, which is adjacent to the first area AA1. The laser beam LB may also be irradiated to a portion of a top surface of the release film RFL which is adjacent (e.g., closest) to the bending area BA. The top surface of the release film RFL may be defined as one surface of the release film RFL that does not face the electronic panel EP (or the display panel DP) and is furthest therefrom. The laser beam LB may be continuously irradiated from the top surface of the protective layer BPL adjacent to the first area AA1, to the top surface of the release film RFL adjacent to the bending area BA.

A portion of the protective layer BPL which is in contact with the side surface OS1 of the functional layer FTL is removed, but it is difficult to precisely irradiate the laser beam LB only up to the portion of the protective layer BPL which is in contact with the side surface OS1 of the functional layer FTL. Therefore, in consideration of a process margin, the laser beam LB may be irradiated up to the top surface of the release film RFL. The laser beam LB may be an ultraviolet (UV) laser. A wavelength of the laser beam LB may be about 344 nanometers (nm).

Figure 30:
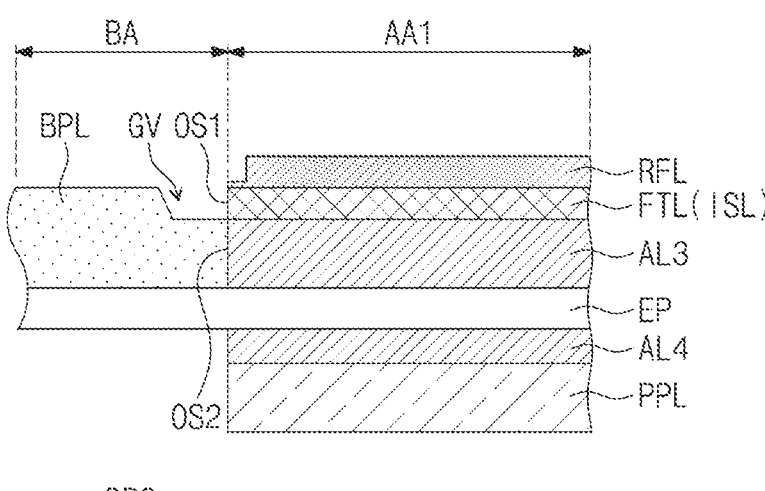
Figure 30:
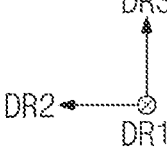

Referring to FIGS. 29 and 30, the portion of the protective layer BPL may be removed by a predetermined depth (e.g., a thickness portion) from the top surface of the protective layer BPL by the laser beam LB, and the groove GV may be formed recessed from the top surface of the protective layer BPL adjacent to the first area AA1. Also, a thickness portion of the release film RFL corresponding to the predetermined depth may be removed starting from the top surface of the release film RFL by the laser beam LB. The functional layer FTL may be protected from the laser beam LB by the release film RFL.

Figure 31:
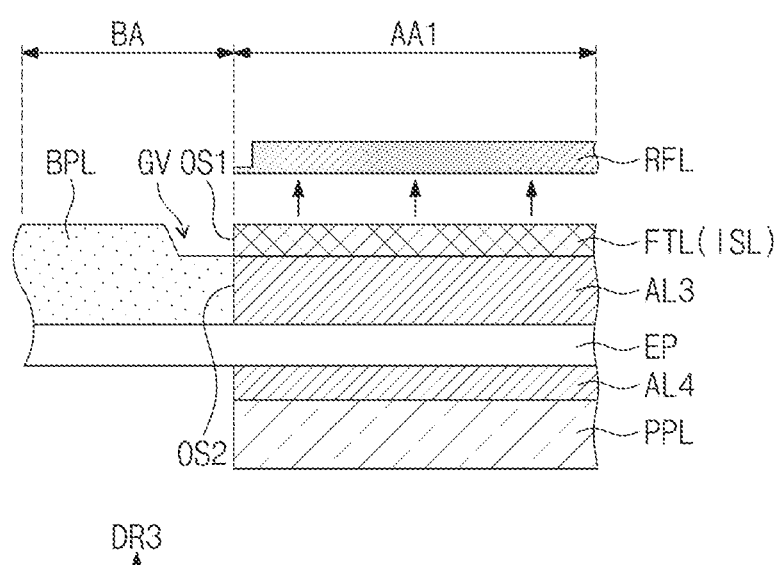
Figure 31:
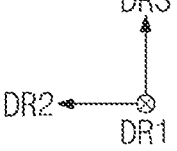

Referring to FIG. 31, the release film RFL may be completely removed from the functional layer FTL. Thus, the display device DD in which the groove GV illustrated in FIG. 18 is formed may be manufactured.

When power of the laser beam LB increases, or an irradiation time of the laser beam LB is set to be long, as illustrated in FIG. 23, a groove GV-1 that is deeper than the groove GV may be formed. In this case, the release film RFL may be removed more deeply than in FIG. 23.

Figure 32:
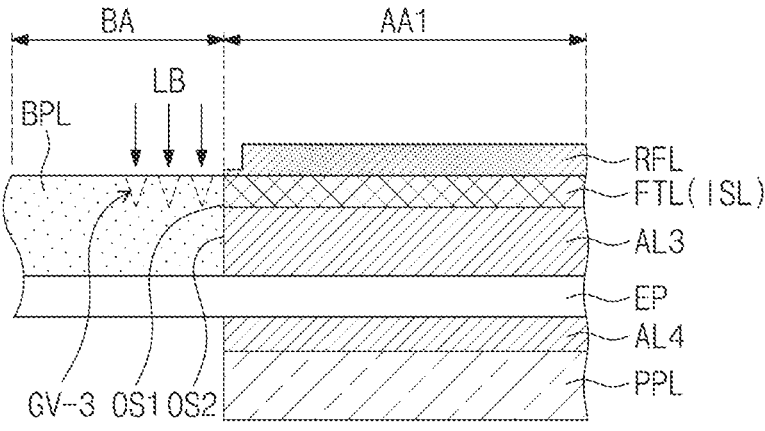
FIG. 32 is a view for explaining a method for manufacturing a display device according to an embodiment of the invention.
Figure 32:
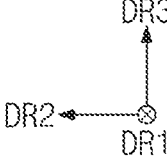
Figure 33:
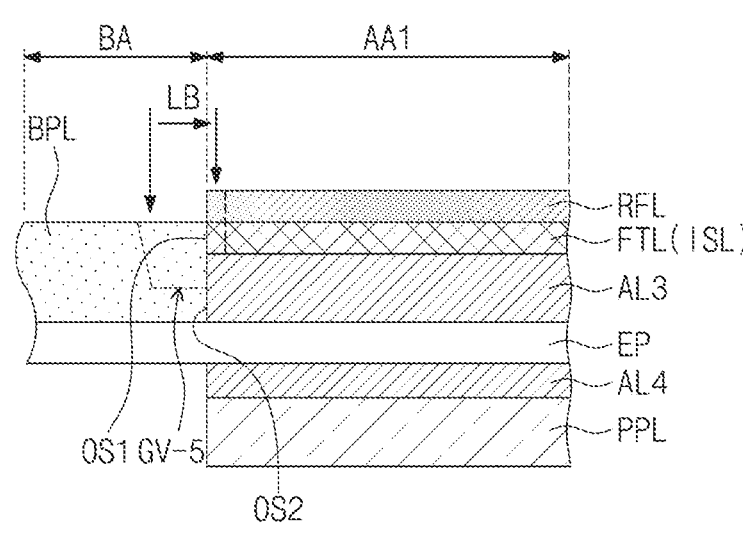
FIG. 33 is a view for explaining a method for manufacturing a display device according to an embodiment of the invention.
Figure 33:
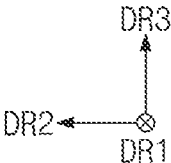

FIG. 32 is a view for explaining a method for manufacturing a display device according to an embodiment of the invention. FIG. 33 is a view for explaining a method for manufacturing a display device according to an embodiment of the invention.

Except for the irradiating of the laser beam LB illustrated in FIGS. 32 and 33 to form the respective grooves GV-3 and GV-5, the method for manufacturing a display device DD according to an embodiment may be the same as the manufacturing method illustrated in FIGS. 28 to 31. Thus, a method of irradiating laser beam LB will be described below.

Referring to FIG. 32, irradiation of the laser beam LB provides a plurality of grooves GV-3 recessed from a top surface of a protective layer BPL adjacent to a first area AA1 and spaced apart from each other in a direction along the electronic panel EP. The grooves GV-3 may be the groove GV-3 illustrated in FIG. 25 and a closest groove may be spaced apart from the side surface OS1 the functional layer FTL.

With respect to FIG. 32, adjustment of an irradiation position of the laser beam LB may provide the grooves GV-2 illustrated in FIG. 24. In addition, adjustment of a power and/or irradiation time of the laser beam LB may provide the grooves GV-4 as illustrated in FIG. 26, the grooves GV-4 which are deeper than the grooves GV-3.

Referring to FIG. 33, the laser beam LB may be irradiated onto a top surface of a release film RFL adjacent to a bending area BA. As the power of the laser beam LB or the irradiation time of the laser beam LB increases, a portion of a release film RFL adjacent to the bending area BA and a portion of the functional layer FTL adjacent to the bending area BA may be removed. The portion of the functional layer FTL adjacent to the bending area BA may be a portion on the above-described non-display area NDA and thus may not affect an operation of a display device DD even if removed.

Therefore, a groove GV-5 illustrated in FIG. 27 may be formed through the above-described process. The groove GV-5 may be formed to be deeper than the groove GV-1.

According to one or more embodiment of the invention, the groove GV may be defined recessed from a portion of the top surface of the protective layer BPL which is most adjacent to the functional layer FTL. The upper thickness portion of the protective layer BPL is spaced apart from the functional layer FTL to define the groove GV together with the lower thickness portion of the protective layer BPL. Thus, an upper thickness portion of the protective layer BPL may be spaced apart from a side surface OS1 of the less flexible layer (e.g., the functional layer FTL). As a result, when the folding operation is performed, the functional layer FTL which slips along the underlying flexible layer (e.g., the third adhesive layer AL3) to be disposed in the bending area BA may not be in contact with (e.g., remain spaced apart from) the protective layer BPL. Therefore, since the functional layer FTL does not push the protective layer BPL, the delamination of the protective layer BPL may be prevented to prevent damage to the bending area BA of the electronic panel EP attached to the protective layer BPL.

In addition, a lower thickness portion of the protective layer BPL which is under the groove GV may be disposed to be in contact with the side surface OS2 of the flexible layer (e.g., the adhesive layer) under the less flexible layer (e.g., the functional layer FTL). Thus, the portion of the bending area BA of the electronic panel EP which is adjacent to the adhesive layer may not be exposed to the outside by the grooved protective layer. Therefore, external static electricity applied to the bending area BA may be blocked by the lower thickness portion of the protective layer BPL, and thus, the electronic panel EP at the bending area BA thereof may be protected.

It will be apparent to those skilled in the art that various modifications and variations can be made in the invention. Thus, it is intended that the invention covers the modifications and variations of this invention provided they come within the scope of the appended claims and their equivalents. Thus, to the maximum extent allowed by law, the scope of the invention is to be determined by the broadest permissible interpretation of the following claims and their equivalents, and shall not be restricted or limited by the foregoing detailed description.

What is claimed is:

1. A display device comprising:
a display panel comprising:
    a first area including a pixel and at which the display panel is foldable,
    a second area on which a driver connected to the pixel is disposed, and
    a bending area between the first area and the second area and at which the display panel is bendable;
a functional layer on the first area; and
a protective layer on the bending area,
wherein
a groove is defined in one surface of the protective layer, which does not face the display panel, and
the groove is adjacent to the first area and exposes one side surface of the functional layer adjacent to the bending area.

2. The display device of claim 1, further comprising an adhesive layer between the functional layer and the first area,
    wherein the one surface of the protective layer, in which the groove is not defined, is disposed higher than the adhesive layer.

3. The display device of claim 2, wherein the protective layer is in contact with one side surface of the adhesive layer, which is adjacent to the bending area, under the groove.

4. The display device of claim 2, wherein a bottom surface of the groove is disposed at the same height as one surface of the adhesive layer, which faces the functional layer.

5. The display device of claim 2, wherein a bottom surface of the groove is disposed lower than one surface of the adhesive layer, which faces the functional layer.

6. The display device of claim 1, wherein when the first area is folded, the groove has a width greater than a slip width of the functional layer that is slipped from the first area to the bending area.

7. The display device of claim 6, wherein the width of the groove is about 100 micrometers to about 300 micrometers.

8. The display device of claim 1, wherein
the groove is provided in plurality including a plurality of grooves, and
the groove which is closest to the functional layer, among the plurality of grooves, expose the one side surface of the functional layer adjacent to the bending area.

9. The display device of claim 1, wherein the one side surface of the functional layer adjacent to the bending area is spaced apart from a boundary between the bending area and the first area and is disposed on the first area.

10. The display device of claim 1, wherein the groove is not defined in the one surface of the protective layer adjacent to the second area.

11. A display device comprising:
a display panel comprising:
    a first area including a pixel and at which the display panel is foldable,
    a second area on which a driver connected to the pixel is disposed, and
    a bending area between the first area and the second area and at which the display panel is bendable;
a functional layer on the first area;
an adhesive layer which bonds the functional layer to the display panel at the first area thereof; and
a protective layer on the bending area, the protective layer facing both the functional layer and the adhesive layer,
wherein
a groove is defined in one surface of the protective layer, which does not face the display panel,
the groove is adjacent to the first area, and
the groove is open at a depth disposed at the same height as one surface of the adhesive layer, which faces the functional layer.

12. The display device of claim 11, wherein the groove is open at a depth disposed lower than the one surface of the adhesive layer, which faces the functional layer.

* * * * *